United States Patent [19]
Aiki et al.

[11] 4,404,678
[45] Sep. 13, 1983

[54] SEMICONDUCTOR LASER DEVICE

[75] Inventors: Kunio Aiki, Hachioji; Michiharu Nakamura, Nishitama; Jun-ichi Umeda, Hachioji, all of Japan

[73] Assignee: Hitachi, Ltd., Tokyo, Japan

[21] Appl. No.: 365,606

[22] Filed: Apr. 5, 1982

Related U.S. Application Data

[62] Division of Ser. No. 786,758, Apr. 12, 1977, Pat. No. 4,326,176.

[30] Foreign Application Priority Data

| Apr. 16, 1976 | [JP] | Japan | 51-42469 |
| May 26, 1976 | [JP] | Japan | 51-60009 |
| Jan. 24, 1977 | [JP] | Japan | 52-5944 |
| Jan. 24, 1977 | [JP] | Japan | 52-5945 |
| Jan. 24, 1977 | [JP] | Japan | 52-5946 |
| Mar. 9, 1977 | [JP] | Japan | 52-24806 |
| Mar. 9, 1977 | [JP] | Japan | 52-24807 |

[51] Int. Cl.$^3$ .............................................. H01S 3/19
[52] U.S. Cl. .................................... 372/45; 372/48
[58] Field of Search ............... 372/45, 46, 48; 357/17

[56] References Cited

U.S. PATENT DOCUMENTS 3,883,821  5/1975  Miller ................................ 372/46

Primary Examiner—James W. Davie
Attorney, Agent, or Firm—Antonelli, Terry & Wands

[57] ABSTRACT

A semiconductor laser device of this invention has a built-in passive guiding mechanism along the junction plane by growing planar double hetero (DH) layers on a grooved or projected substrate. It operates stably in the lowest transverse mode and provides light-output versus current characteristics free of either kinks or any anomalies.

10 Claims, 41 Drawing Figures

FIG. 30
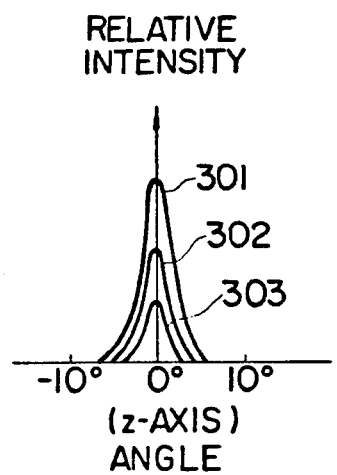
FIG. 32
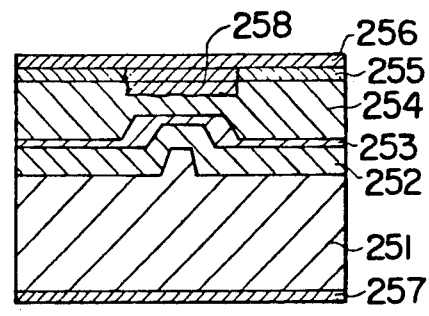
FIG. 31
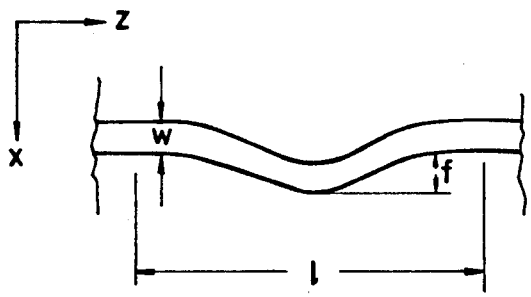
FIG. 33a
FIG. 33b
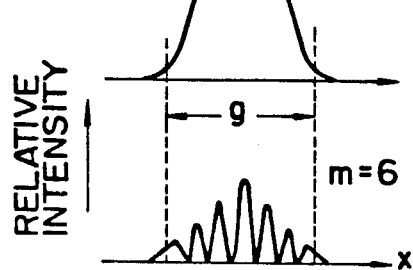
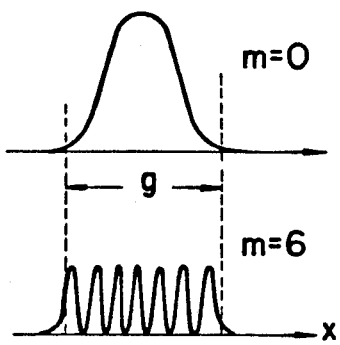

4,404,678

SEMICONDUCTOR LASER DEVICE

This is a division of application Ser. No. 786,758, filed Apr. 12, 1977, now U.S. Pat. No. 4,326,176.

BACKGROUND OF THE INVENTION

(1) Field of the Invention

This invention relates to a double-hetero structure semiconductor diode laser device. More particularly, the invention relates to a structure of a semiconductor laser device having a stabilized lasing mode and a high reliability.

(2) Description of the Prior Art

Semiconductor laser devices are now indispensable elements as light sources in optical communication systems. As is well known in the art, a double hetero (DH) structure is adopted for semiconductor devices which operate effectively at room temperature. A typical structure of the most advanced prior art GaAs-GaAlAs double hetero semiconductor laser device is illustrated in FIGS. 1-a and 1-b. FIG. 1a is a view showing the section of the element taken along a direction parallel to light, and FIG. 1-b is a view showing the section of the element of FIG. 1-a taken along a direction perpendicular to light. Such an element is ordinarily prepared by growing on an n-GaAs substrate1 a layer 2 of n-Ga$_{1-x}$Al$_x$As (for example, x is 0.3) corresponding to a second semiconductor, a layer 3 of p-GaAs corresponding to a first semiconductor, a layer 4 of p-Ga$_{1-x}$Al$_x$As (for example, x is about 0.3) corresponding to a third semiconductor and a layer 5 of p-GaAs facilitating electric connection to a positive electrode 6 by successive liquid phase epitaxy, then forming electrodes and cleaving crystals to form a reflection face 8. Reference numeral 7 represents a negative electrode. When this laser device is driven at 2.2 V and 100 mA (2 KA/cm$^2$) at room temperature, a continuous light output power of ~8900 Å and ~10 mW under CW conditions is obtained. The laser device having the above structure can easily be prepared in a high production yield and it has a long life and a high reliability. However, a laser device of this type is defective in that the lasing mode becomes unstable. More specifically, in the above structure, the region of the first semiconductor layer 3 below the positive electrode 6 has a lasing action, but since the refractive index is not intentionally changed in the direction x in this layer, the lasing mode in the direction x is determined by a slight refractive index profile and gain profile generated by application of an electric current. Such a refractive index profile or gain profile is remarkably changed depending on changes in the excitation current or temperature and on configurations of the element such as the layer thickness. Accordingly, in general, the lasing mode shows very irregular changes and has no reproducibility. This unstability of the transverse mode has bad influences on the linearity of the excitation current or light output power. When modulation is conducted by a pulsating current, unstable variations are caused in the light output power, the signal-to-noise ratio is degraded, and the directivity of the output light is rendered unstable. Therefore therefore, it becomes difficult to introduce the light output power at a high efficiency stably to other optical systems such as light fibers. Thus, practical use of such laser device involves various problems.

Some attempts have heretofore been made to eliminate the foregoing disadvantages. For example, a so-called BH (buried hetero structure) laser device has been developed [T. Tsudaka, J. Appl. Phys., 45, 4897 (1957)]. A sectional view of this laser device is illustrated in FIG. 2. Referring now to FIG. 2, a p-GaAs layer 3 which is a region having a lasing action is surrounded by an n-Ga$_{1-x}$Al$_x$As layer 2, a p-Ga$_{1-x}$Al$_x$As layer 4 and an n-Ga$_{1-x}$Al$_x$As layer 9, each having a lower refractive index than that of the layer 9. In this arrangement, a definite change of the refractive index is present also in the direction x. Accordingly, the transverse mode is stabilized, and characteristic difficulties involved in the element structure shown in FIGS. 1-a and 1-b are eliminated. In order to realize the element structure shown in FIG. 2, an n-Ga$_{1-x}$Al$_x$As layer 2, a p-GaAs layer 3 and a p-Ga$_{1-x}$Al$_x$As layer 4 are grown on an n-GaAs substrate 1 by successive liquid phase epitaxy, and then, the structure is processed into a mesa-stripe form and an n-Ga$_{1-x}$Al$_x$As is grown by liquid phase epitaxy. Accordingly, the production steps are complicated and the production yield is very low. In addition to these defects, there is another defect that during the production process, especially at the regrowth step, crystal defects are readily caused and have bad influences on factors concerning the practical utility, such as life and reliability.

A spot-like laser device capable of lasing in the single transverse mode is applicable as a light source for single mode fiber communication or a light source for light information processing devices such as a video disk, and development of a laser device meeting requirements in this application field is desired in the art. In this application field, it generally is required that the width of spots of the light output power should be between about 1 to about 8 μm.

As the laser device in which a single transverse mode operation is obtained in the junction face of the laser, there can be mentioned a buried hetero structure laser device as illustrated in FIG. 2 and a transverse-junction stripe laser device (IEEE Journal of Quantum Electronics, Vol. QE-11, No. 7, July, 1975). The former device is defective in that the spot width is limited to about 1 μm or less and growth of crystals must be conducted 2 times. The latter device is defective in that zinc must be diffused deeply even into the lasing active region after growth of crystals and, therefore, a complete reliability cannot be attained.

SUMMARY OF THE INVENTION

It is a primary object of the present invention to provide a structure of a semiconductor laser device which is free of the above-mentioned defects of the double hetero structure and has a stabilized lasing mode and which can easily be prepared.

Another object of the present invention is to provide a semiconductor laser device which has a low threshold current density enabling stabilization of the lasing mode.

Still another object of the present invention is to provide a structure of a semiconductor laser device which has a high reliability and a long life and in which the lasing mode is stabilized.

A further object of the present invention is to provide a structure realizing a semiconductor laser in which a single fundamental operation is possible with a stabilized lasing mode.

In the present invention, the foregoing objects can be attained by a semiconductor device comprising a semiconductor substrate and a plurality of semiconductor layers disposed on said substrate, said plurality of semiconductor layers including a first semiconductor layer composed of a first semiconductor and second and third semiconductor layers between which said first semiconductor layer is disposed, each of said second and third semiconductor layers having a band gap broader than that of said first semiconductor layer, wherein a non-lasing region having an effective complex refractive index different from that of a laser active region of said first semiconductor layer is disposed laterally with respect to said laser active region.

The foregoing problems involved in the conventional semiconductor laser devices are solved in the present invention by a semiconductor laser structure which will be described in detail hereinafter.

The gist of the structure of the first type semiconductor laser element according to the present invention is first described. Second and third semiconductor layers, each consisting of a semiconductor having a band gap broader than that of a first semiconductor and a refractive index smaller than that of the first semiconductor, are bonded to both the sides of a first semiconductor layer consisting of the first semiconductor. In at least one of said second and third semiconductor layers, a thickness difference is made in at least a boundary between the lasing region and other region, and a semiconductor layer having a complex refractive index different from said semiconductor layer is disposed along the thickness-reduced region of said semiconductor layer.

This semiconductor layer varying in the thickness (at least one of said second and third layers) is arranged so that the lasing region corresponds to a region of a larger thickness and the remaining region corresponds to a region of a smaller thickness. By this disposition, good results are attained with respect to the optical gain. The reasons will be apparent from the description given hereinafter. Needless to say, even if the reverse arrangement is adopted, namely even if the thickness is changed so that the lasing region corresponds to a region of a smaller thickness and the non-lasing region corresponds to a region of a larger thickness, an effect of confining lased light in the prescribed region can similarly be attained.

According to one modification of the semiconductor laser device of the present invention, a fourth semiconductor layer is formed on the semiconductor substrate and a stripe channel is formed on the fourth semiconductor layer, and first to third semiconductor layers are disposed on said fourth semiconductor layer. When an electric conductivity type opposite to that of the substrate is given to the fourth semiconductor layer, an electric current can be allowed to run selectively in the portion of the channel. Further, when the same electric conductivity type as that of the substrate is given to the fourth semiconductor layer and the specific resistivity of the fourth semiconductor layer is higher than that of the semiconductors in the channel, expansion of the electric current can be reduced. Still further, this fourth semiconductor layer acts as a so-called buffer layer and defects are much reduced. Accordingly, a laser device having a long life can be obtained in a high production yield.

According to another modification of the semiconductor laser device of the present invention, the width of the large thickness region of the second or third semiconductor layer is adjusted in the range of from 2 $\mu$m to 8 $\mu$m and the loss of the optical gain in the optical wave guide on the large thickness region is smaller by at least 40 cm$^{-1}$ than the loss in the optical wave guide in the adjacent small thickness region, whereby a semiconductor laser device performing the lasing operation in the stabilized lowest transverse mode can be provided. The laser device of this modification fully meets the requirement when a semiconductor laser device capable of a single mode lasing operation is required.

According to still another modification of the semiconductor laser device of the present invention, a stripe protrusive portion is formed on the second or third semiconductor layer on the side of the first semiconductor layer, and the first semiconductor layer is made protuberant along said protrusive portion, whereby by the refractive index is changed with respect to the transverse direction of the laser active region of the first semiconductor layer.

BRIEF DESCRIPTION OF THE DRAWINGS

FIG. 1-$b$ is a view showing the section of the semiconductor laser device of FIG. 1-$a$ taken along a direction rectangular to light.

FIG. 7-$b$ shows the far field intensity profile in the x-z face of the conventional DH laser device shown in FIGS. 1-$a$ and 1-$b$.

FIG. 27-b shows the far field intensity profile of the semiconductor laser device shown in FIGS. 1-a and 1-b.

FIG. 30 shows the far field intensity profile in the x-z face of the semiconductor laser device shown in FIG. 29.

FIG. 31 is a diagram illustrating the concept of a semiconductor laser device in which a stripe channel or protrusion is curved.

FIG. 32 is a sectional view showing a modification of the semiconductor laser device shown in FIG. 25 in which the thickness of the active layer is changed.

FIG. 33a shows the near field intensity profile in the direction x in the light wave guide of the semiconductor laser device shown in FIG. 32.

FIG. 33b shows the near field intensity profile in the direction x in the light wave guide in the BH laser device shown in FIG. 2.

FIG. 35-b illustrates the lasing spectrum of the composite semiconductor laser device shown in FIG. 34.

DETAILED DESCRIPTION OF THE INVENTION

Figure 1A:
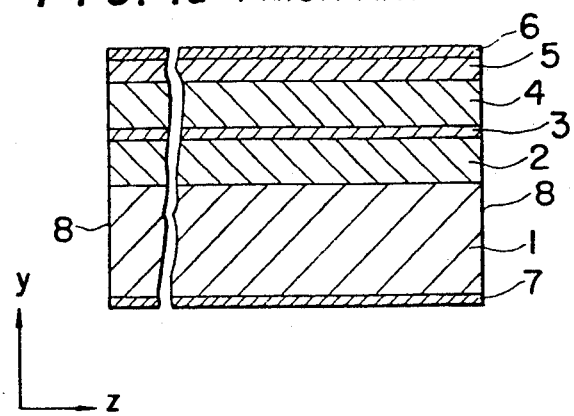
FIG. 1-$a$ is a view showing the section of a conventional semiconductor laser device of the double hetero structure taken along a direction parallel to light.

The basic principle of the present invention is now illustrated by reference to FIG. 3 which is a sectional view showing main parts of a typical instance of the semiconductor laser device of the present invention.

Reference numeral 11 represents a substrate crystal having a stripe channel formed thereon, and layers described below are grown in succession on this substrate 11. A second semiconductor layer 12 has a portion projected toward the substrate 11. Reference numerals 13 and 14 represent a first semiconductor layer and a third semiconductor layer, respectively. The first semiconductor layer performing the lasing operation is sandwiched between the second and third semiconductor layers, each consisting of a semiconductor having a band gap broader than that of the semiconductor of the first semiconductor layer and a refractive index smaller than that of the semiconductor of the first semiconductor layer. Thus, there is established a so-called double hetero structure in which the carrier and photon are confined at high density in the first semiconductor layer.

In this embodiment, the substrate crystal 11 constitutes a region absorbing waves evanescent from the thickness-reduced region of the second semiconductor layer 12, namely a region in which the imaginary portion of the complex refractive index is changed. This embodiment will now be described in detail by reference to the case where GaAs and GaAlAs are used as semiconductor layers.

In general, the substrate consists of GaAs or $Ga_{1-z}Al_zAs$, the first semiconductor layer consists of $Ga_{1-y}Al_yAs$ and each of the second and third semiconductor layers consists of $Ga_{1-x}Al_xAs$, in which a relation of $0 \leq z \leq y < x < 1$ is ordinarily established. The thickness $t_1$ of the thickness-reduced portion of the second semiconductor layer 12 is so small that the tail of the evanescent wave along the first semiconductor layer reaches the substrate 11. The thickness $t_2$ of the large thickness portion of the second semiconductor layer is sufficiently larger than the thickness $t_1$.

Figure 4:
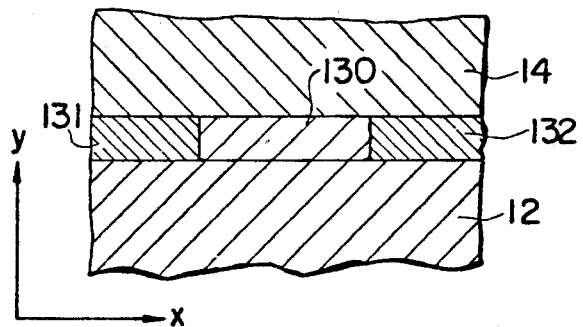
FIG. 4 is a view showing diagrammatically a wave guide structure in the semiconductor device of the present invention.

This structure performs a function equivalent to the function of the wave guide in which either or both of the effective refractive index and the optical gain or loss are changed in the direction x of the wave guide layer. This wave guide structure is diagrammatically shown in FIG. 4.

As pointed out, the refractive index is changed in the direction y by the material per se constituting the semiconductor layers 12 and 14. In addition, also with respect to the direction x, regions 131 and 132 differing in the effective composite refractive index can be set. In regions 131 and 132 of the semiconductor layer 13, either or both of the effective refractive index and the optical loss or gain are made different from those of the semiconductor layer 13 by the penetrating effect of the evanescent wave into the substrate crystal 11. When the refractive index of the substrate crystal 11 is higher than that of the semiconductor layer 12, the effective refractive index of each of the regions 131 and 132 is higher than that of the semiconductor layer 13. In the contrary case, the effective refractive index of each of the regions 131 and 132 is lower than that of the semiconductor layer 13. The same holds true with respect to the optical gain or loss.

In a practical device, suitable electrodes are disposed on the sides of the substrate and the third semiconductor layer 14 (reference numerals 15, 16, 17 and 18 represent portions constituting electrodes as illustrated in Embodiments given hereinafter). In this structure, guided light is distributed with the region 130 of the first semiconductor layer 13 being as the center, and is propagated in a direction perpendicular to the drawing surface. Characteristics of the semiconductor laser device of the present invention is strongly influenced by the thickness of the second semiconductor layer 12. As pointed out hereinbefore, the thickness of the thickness-reduced portion of the semiconductor layer 12 is adjusted so that the tail of the evanescent wave reaches the substrate. Supposed that the depth in which the evanescent wave from the semiconductor layer 12 in the direction y decays by 1/e is defined as r, it can approximately be represented as follows:

$$r = \frac{A}{\pi}\left[1 - \left(\frac{A}{d}\frac{1}{1+\frac{A+A'}{\pi d}}\right)^2\right]^{-\frac{1}{2}} \quad (1)$$

wherein $A = \frac{\lambda}{2(n_{13}^2 - n_{12}^2)^{\frac{1}{2}}}$, $A' = \frac{\lambda}{2(n_{13}^2 - n_{14}^2)^{\frac{1}{2}}}$, $\lambda$ represents a free space wave length, $n_{12}$, $n_{13}$ and $n_{14}$ represent refractive indexes of the semiconductor layers 12, 13 and 14, respectively, and d denotes the thickness of the semiconductor layer 13.

Incidentally, the method for calculation of an approximate value of the penetrating depth is described in the thesis of E. A. J. Marchatili reported on Bell Syst. Tech. J., 48, pp. 2071-2102 (1969).

When the above equation is taken into consideration, it will be apparent that the evanescent wave does not substantially penetrate over a depth exceeding 3r. In view of the principle of the present invention, it is apparent that as the thickness $t_1$ is smaller, the transverse mode operation is more stabilized. Referring to the above equation, it may be said that if the thickness $t_1$ of the thickness-reduced portion of the semiconductor layer 12 is set so that the condition of $t_1 \leq 3r$ is satisfied, good results will be obtained.

In the foregoing instance where GaAs and GaAlAs are used as semiconductor layers, d is adjusted in the range of about 0.05 to about 0.2 μm in the actual operation. In this case, r is about 0.3 μm. In practical viewpoint, it is preferred that $t_1$ be about 0.3 to 0.7 μm (this holds good when the refractive index of the second semiconductor layer is the same as that of the third semiconductor layer; the asymmetric case where both the refractive indexes are different will be described hereinafter) and $t_2$ be sufficiently larger than the penetrating depth 3r, more specifically at least about 0.9 μm, for example, about 1.5 μm. In the case where a channel is formed on the substrate, from the practical viewpoint, it is preferred that the width W of the channel be in the range of about 1 to about 30 μm. If the width W is broader than this range, it is difficult to form the top face of the protuberant portion of the second semiconductor layer as a plane face. The semiconductor laser device having the above-mentioned structure in which a channel is formed on a substrate crystal has the following advantages:

(1) Since the structure can be formed by one successive liquid phase epitaxy, the production can be remarkably facilitated.
(2) During the preparation process, mesa etching need not be performed for formation of semiconductor layers 12, 13 and 14.
(3) Since a planar stripe geometry is attained, the resulting structure is excellent in the reliability and thermal diffusion characteristics.

In the foregoing arrangement, the second semiconductor layer is formed to comprise a sufficiently thick protuberant portion corresponding to the lasing region and a thin portion corresponding to the other region.

The change of the effective loss coefficient of the wave guide in the direction x in the semiconductor laser device having the above structure will now be described.

In the portion of the second semiconductor layer other than the protuberant portion, the tail of the evanescent wave reaches the crystal substrate 11 and a part of the wave is absorbed in this portion. On the other hand, in the protuberant portion, such absorption does not take place. Accordingly, the effective loss coefficient of the wave guide in the other portion is sufficiently higher than that in the protuberant portion. Light waves are guided by this difference of the effective loss coefficient in the transverse direction parallel to the junction face, and the lasing operation is conducted stably in the transverse mode with the region 130 of the first semiconductor layer 13 present above the protuberant portion of the second semiconductor layer 12 being as the center. This feature is based on the wave guide effect owing to the difference of the effective loss coefficient. In general, this object can be attained by generating a difference of the composite refractive index. As will be apparent from the foregoing illustration made on the principle of the present invention, the above special effect is not due to the use of specific constituent materials. In other words, the present invention can be applied not only to lasers of materials of the Ga-Al-As and Ga-Al-As-Sb series but also to lasers of materials of the Ga-Al-As-P, Ga-As-P and In-Ga-As series, semiconductor compounds of elements of the groups III-V and II-V and other semiconductor materials.

As pointed out hereinbefore, the objects of the present invention can be advantageously attained if the thickness $t_1$ of the semiconductor layer 12 is set so that the tail of the evanescent wave penetrates in the substrate. In practice, the objects of the present invention can be attained more advantageously if the following laminate structure is adopted when the thickness $t_1$ is set.

Figure 5:
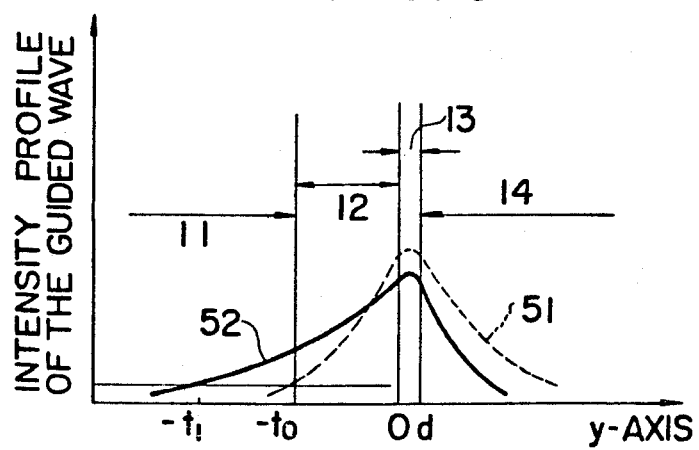
FIG. 5 is a view showing guided wave profiles in the interior of the semiconductor device of the present invention, which are observed when the refractive index of a second semiconductor layer is larger than and equal to the refractive index of a third semiconductor layer, said second and third semiconductor layers being disposed so that a first semiconductor layer is sandwiched therebetween.

The refractive indexes of the second and third semiconductor layers sandwiching the first semiconductor layer therebetween are set in the following manner:

Namely, the refractive index of the semiconductor layer having the thickness varied stepwise is made larger than the refractive index of the semiconductor layer disposed on the opposite side with the first semiconductor layer interposed therebetween. Referring now to FIG. 3, for example, the refractive index $n_{12}$ of the semiconductor layer is made larger than the refractive index $n_{14}$ of the semiconductor layer 14 (namely, the relation of $n_{12} > n_{14}$ is established). The guided wave profile attained in this case is illustrated in FIG. 5. The abscissa indicates the thickness of the crystal and the ordinate indicates the intensity of the guided wave. Reference numerals 11, 12, 13 and 14 in FIG. 5 indicate regions of the semiconductor layers represented by the same reference numerals. Curve 51 shows the guided wave profile observed when the refractive index of the semiconductor layer 12 is the same as that of the semiconductor layer 12 ($n_{12} = n_{14}$) and curve 52 shows the guided wave profile observed when the relation of $n_{12} > n_{14}$ is established between the refractive indexes of both the layers. In the case of $n_{12} = n_{14}$, the guided wave intensity profile is symmetric with the first semiconductor layer 13 being as the center. As pointed out hereinbefore, the thickness $t_o$ of the thin portion of the semiconductor layer 12 satisfies the requirement of $t_o \leq 3r$. In contrast, in the case of $n_{12} > n_{14}$, as is seen from the curve 52, the guided wave intensity profile is asymmetric and is deviated toward the substrate crystal 11. Accordingly, even if $t_1$, that is larger than $t_o$, is selected for the thickness of the thin portion of the semiconductor layer 12, an effect equivalent to the effect in the case of $n_{12} = n_{14}$ can be substantially obtained. Of course, also in this case, the requirement of $t_1 \leq 3r$ should be satisfied. By virtue of such arrangement, the following advantages can be attained.

A relatively large thickness may be selected for the second semiconductor layer (especially for the thin region of the layer 12 in FIG. 3) and hence, control of the thickness of the semiconductor layer 12 can be remarkably facilitated. Moreover, although interfacial defects are present on the interface between the substrate crystal 12 and the semiconductor layer 12 because it is a first crystal growth interface, since the thickness of the semiconductor layer 12 can be increased, the laser active layer (namely, the first semiconductor layer) is not influenced by such interfacial defects and the reliability of characteristics can be enhanced. The degree of increase of the thickness t of the semiconductor layer 12 attainable by making the refractive index of the semiconductive layer 12 larger than that of the semiconductor layer 14 can be approximately known from the following formulae.

Figure 3:
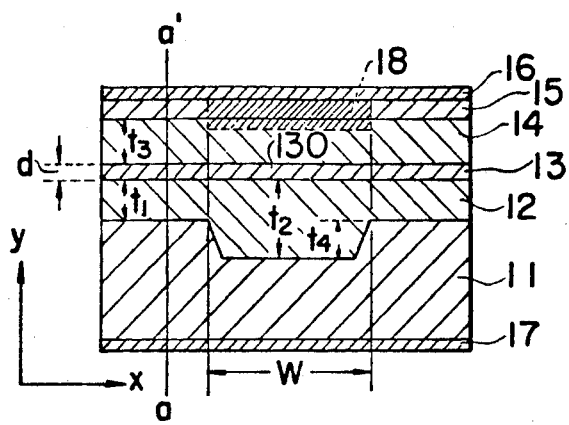
FIG. 3 is a sectional view showing the basic structure of the semiconductor laser device of the present invention.

Supposed that the refractive index of the first semiconductor layer 13 is $n_{13}$, the thickness of the layer 13 is d, the refractive index of the layer 12 is $n_{12}$, the ratio of the light energy present in the substrate crystal 11 to the total energy in the light distribution with respect to the direction y along the line a-a' in FIG. 3 is F and the lased light wave length is $\lambda$, and that the following relations are established $$k = (2\pi/\lambda) \quad (2)$$

and $$G^2 = k^2(n_{13}^2 - n_{12}^2) \quad (3)$$

then the ratio of t to $t_o$ is expressed as follows:

$$\frac{t}{t_o} = 2m^2 \cdot \frac{\ln\frac{m}{m+1} - \ln F}{\ln\frac{1}{2} - \ln F} \cdot \frac{\sqrt{1 + d^2G^2} - 1}{\sqrt{(m+1)^2 + 4m^2d^2G^2} - (m+1)} \quad (4)$$

In the above formula (4), m is a parameter indicating the degree of asymmetry of the light distribution, and the refractive index $n_{14}$ of the semiconductor layer 14 and the refractive index $n_{12}$ of the semiconductor layer 12 has a relation represented by the following formula:

$$n_{12}^2 - n_{14}^2 = \frac{\sqrt{m^2 - 1}}{2k^2dm^2} \{\sqrt{(m+1)^2 + 4d^2G^2m^2} - (m+1)\} \quad (5)$$

In the case of the symmetric distribution ($n_{14} = n_{12}$), m is equal 1, and in the case of the asymmetric distribution, m is larger than 1.

From the above formulae (4) and (5), it will readily be understood that if the refractive index $n_{12}$ of the semiconductor layer 12 is made larger than the refractive index $n_{14}$ of the semiconductor layer 14 according to the present invention, m becomes large and $t/t_o$ increases sharply.

The formula (4) indicates that the larger the value of m (the degree of asymmetry), the larger the value of $t/t_o$. However, if the degree of asymmetry is too high, the ratio of the lased light present in the semiconductor layer 13 is reduced and therefore, the current density necessary for causing lasing operation (hereinafter referred to merely as "current density") is increased. If the degree of asymmetry is m, the threshold current density Jth is expressed by the following formula:

$$\frac{J_{th}}{J_{tho}} = \sqrt{\frac{m(m+1) \cdot \{\sqrt{1 + d^2G^2} - 1\}}{\sqrt{(m+1)^2 + 4d^2G^2m^2} - (m+1)}} \quad (6)$$

wherein Jtho represents the threshold current density when m is equal to 1 (namely, the distribution is symmetric and $n_{12}$ is equal to $n_{14}$).

As will be apparent from the formula (6), the degree of increase of Jth/Jtho attained by increasing m is much lower than the degree of increase of $t/t_o$. Therefore, according to the present invention, an effective device can be designed because a higher value of $t/t_o$ can be obtained while increase of Jth is maintained at a low level.

The refractive indexes of the above-mentioned semiconductor layers can be controlled by changing the compositions of the materials constituting the respective layers. For example, in the case of a material of the $Ga_{1-x}Al_xAs$ series, the refractive index can be lowered by increasing the composition ratio x of Al. Further, in the case of a material of the $Al_yGa_{1-y}As_xSb_{1-x}$ series, the refractive index can be lowered by increasing either or both of x and y.

The present invention will now be described in detail by reference to the following Embodiments.

Embodiment 1

The section of a semiconductor laser device in Embodiment 1 of the present invention is as shown in FIG. 3. Reference numeral 13 represents a layer of $n-Ga_{0.95}Al_{0.05}As$ corresponding to a first semiconductor, and reference numeral 14 represents a layer of $p-Ga_{1-x}Al_xAs$ ($x \approx 0.3$) corresponding to a third semiconductor. Reference numeral 11 represents an n-GaAs substrate having a channel, reference numeral 12 represents a layer of $n-Ga_{1-x}Al_xAs$ ($x \approx 0.3$), reference numeral 15 represents an n-GaAs layer, reference numeral 16 represents a positive electrode, reference numeral 17 represents a negative electrode, and reference numeral 18 represents a Zn-diffused region. This semiconductor laser device is prepared in the following manner.

A photoresist film having a window having a width of 10 μm is formed by customary photolithography on an n-GaAs substrate crystal having a face index (100) (Te is incorporated at a concentration of $\sim 1 \times 10^{18}$ $cm^{-3}$). The surface of the substrate is chemically etched at 20° C. through this window with a 1:1:3 mixture of phosphoric acid:hydrogen peroxide:ethylene glycol to form a channel extending in the direction z. The width (W) of the channel is about 10 μm and the depth ($t_4$) is 1.5 μm. Then, layers 12, 13, 14 and 15 are formed on this substrate by successive liquid phase epitaxy. Compositions of solutions used for formation of the respective semiconductor layers and the growing times are as shown in Table 1.

TABLE 1

| Composition of Solution | Layer 12 | Layer 13 | Layer 14 | Layer 15 |
|---|---|---|---|---|
| Ga (g) | 4 | 4 | 4 | 4 |
| GaAs (mg) | 200 | 200 | 200 | 200 |
| Al (mg) | 3 | 0.2 | 3 | — |
| Sn (mg) | 300 | — | — | 100 |
| Ge (mg) | — | — | 70 | — |
| Growing Time (minutes) | 2 | 1/30 | 8 | 1 |

The saturated solution for the layer 12 is cooled from 780° C. at a rate of about 0.4° C./min, super-cooling is conducted for 3 minutes and the crystal is grown by successive liquid phase epitaxy. The thickness ($t_1$) of the thin portion of the layer 12 is adjusted to 0.3 μm. The thicknesses of the layers 13, 14 and 15 are 0.1 μm, 2 μm and 1 μm, respectively. As an impurity additive, Sn is used for the n-type layer and Ge is used for the p-type layer. Then, Zn is diffused through a window of $Al_2O_3$ formed by photolithography in the same manner as described above, to thereby form a p-type diffusion layer 18. Au and Cr and an Au-Ge-Ni alloy are vacuum-deposited to form positive electrode 16 and negative electrode 17. Finally, the crystal is cleft on a plane of a face index (110) so that a confronting parallel face is formed, whereby a reflector is formed. Thus, a laser device having a laser length of 300 μm is prepared.

When epitaxial growth is effected on the top face of a substrate having a channel as in this Embodiment, if the top face of the semiconductor layer 12 is made substantially plane, the effects of the present invention can be attained more advantageously. More specifically, if the top face of the semiconductor layer 12 is made substantially plane, the thick and thin regions of the semiconductor layer 12 can be conveniently formed, and the active layer and the like can also be formed conveniently. This feature is attained if the saturated solution is cooled at a temperature reduction rate of up to 0.5° C./min at the epitaxial growth step. From the practical viewpoint, it is preferred that the temperature be lowered at a rate of about 0.01 to about 0.5° C./min.

Figure 6:
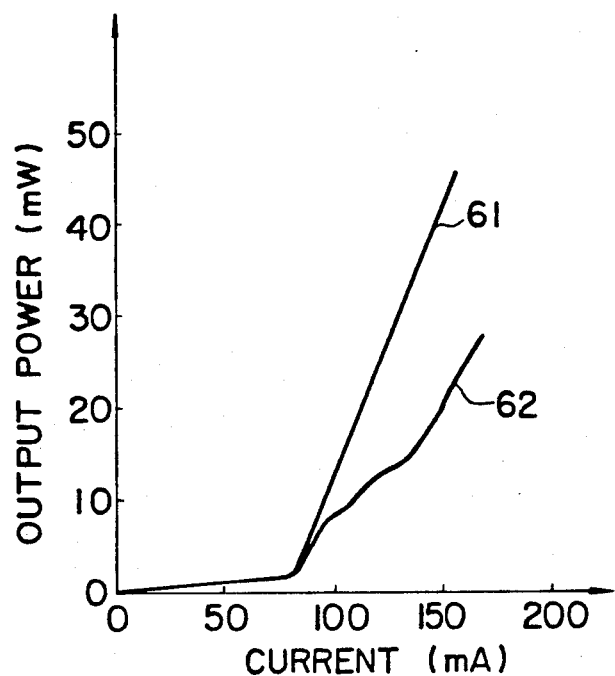
FIG. 6 illustrates typical light output versus current characteristics in a semiconductor laser device of Embodiment 1.
Figure 7A:
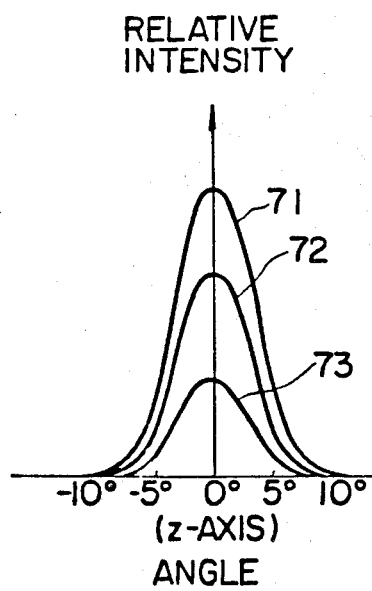
FIG. 7-$a$ shows the far field intensity profile in the x-z face of the semiconductor laser device of Embodiment 1.
Figure 7B:
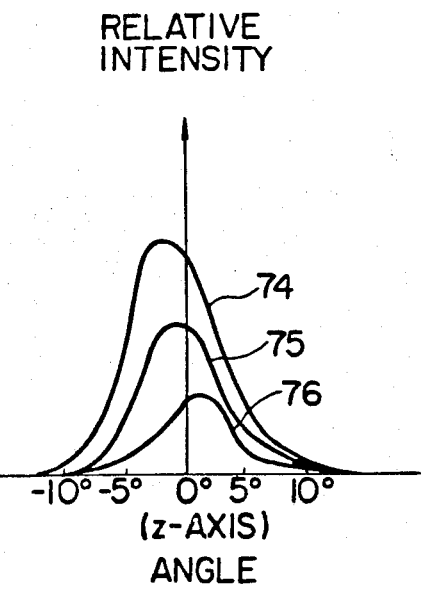

The above semiconductor laser device can perform a lasing operation at a threshold current density of $\sim 2KA/cm^2$ at room temperature. The lasing wave length is $\sim 8300$ A and the external differential quantum efficiency is about 40%. FIG. 6 illustrates the relation between the exciting current and the light output power. Curve 61 shows results obtained with respect to the laser device of this Embodiment. Curve 62 shows results obtained with respect to the conventional structure shown in FIGS. 1-a and 1-b. In the laser device of the present invention, the transverse lasing mode is stable at an exciting current 2 times the threshold current which is practical for the operation of the laser device, and non-linear characteristics of the output intensity and light output such as curvatures called "kinks" and reduction of the signal-to-noise ratio at the pulse modulation, which are observed in the conventional structure, are not observed at all. FIGS. 7-a and 7-b show the light output profiles in the x-z plane of the above laser device of the present invention and the above conventional structure, respectively. Respective curves in FIGS. 7-a and 7-b show results obtained at various exciting currents. More specifically, curves 71 and 74 show results at 1.3 Jth, curves 72 and 75 show results obtained at 1.2 Jth and curves 73 and 76 show results obtained at 1.07 Jth [Jth stands for the threshold current value (ampere unit)].

From these results, it is seen that in the conventional structure, the light output profile is irregularly changed depending on the change of the exciting current but when the structure of the present invention is adopted, the output profile can be remarkably stabilized. In connection with the life of the element, there is observed no substantial difference between the structure of the present invention and the conventional structure.

Figure 8:
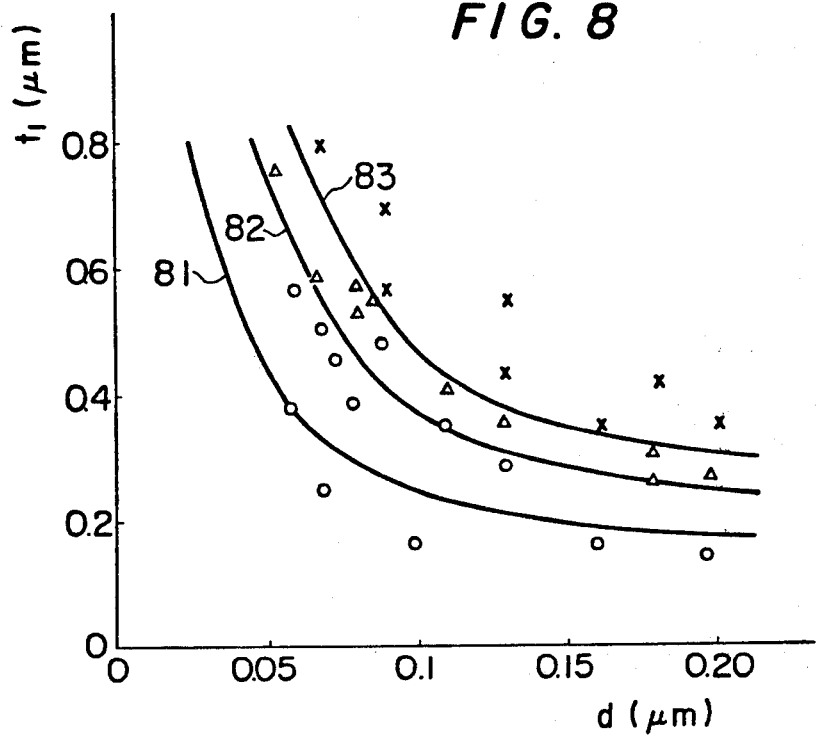
FIG. 8 shows lasing characteristics observed when the thickness d of an active layer and the thickness $t_1$ of a thinner portion of the second semiconductor layer are changed in the semiconductor laser device of Embodiment 1.

In the semiconductor device of this Embodiment, the lasing operation characteristics are examined while changing the thickness d of the first semiconductor layer and the thickness $t_1$ of the thin portion of the second semiconductor layer. Results are shown in FIG. 8. Symbols O, Δ and X in FIG. 8 indicate the following characteristics:

O: A linear relation is established between the exciting current and the light output power at up to about 30 mW, and noises are very small. Accordingly, it can be judged that the characteristics are excellent.

Δ: A linear relation is established between the exciting current and the light output power at up to about 30 mW but generation of noises is relatively apparent (the output of noises is about 20 to about 30% of the light output). It can be judged that the characteristics are good.

X: The relation between the exciting current and the light output power is not linear and generation of noises is conspicuous. It can be judged that the characteristics are bad.

In FIG. 8, curves 81, 82 and 83 illustrate the penetration depth r, 2r and 3r, respectively, as functions of the thickness of the first semiconductor layer.

From results shown in FIG. 8, it will clearly be understood that when the penetration depth r and the thickness $t_1$ of the thin portion of the second semiconductor layer are arranged so that the requirement of $t_1 \leq 3r$ is satisfied, good results can be obtained, and it is more preferred that the condition of $t_1 \leq 2r$ be satisfied.

Embodiments 2 to 4

Tests are conducted in the same manner as described in Embodiment 1 while changing materials and dimensions of the respective layers 12, 13 and 14 as indicated in Table 2. Substantially the same effects are similarly attained. Conditions other than those shown in Table 2 are the same as in Embodiment 1.

TABLE 2

| Embodiment No. | Layer 12 n-Ga$_{1-x}$Al$_x$As | Layer 13 n-Ga$_{1-y}$Al$_y$As | Layer 14 p-Ga$_{1-z}$Al$_z$As | Channel Depth (μm) | Thickness (μm) of Thin portion of Layer 12 | Thickness (μm) of Layer 13 |
|---|---|---|---|---|---|---|
| 2 | x = 0.33 | y = 0.05 | z = 0.36 | 1.5 | 0.45 | 0.1 |
| 3 | x = 0.33 | y = 0.05 | z = 0.33 | 1.5 | 0.7 | 0.05 |
| 4 | x = 0.33 | y = 0.05 | z = 0.40 | 1.5 | 0.2 | 0.25 |

In each of semiconductor laser devices of Embodiments 2 to 4, the threshold current density at room temperature is 2 KA/cm$^2$, the lasing wave length is 8300 Å and the external differential quantum efficiency is about 40%. Only the fundamental transverse lasing mode is observed when the exciting current is up to 1.3 times the threshold current value. The relation between the exciting current higher than the threshold current value and the light output power is linear if the exciting current is in the above range. Reduction of the signal-to-noise ratio is not observed at the pulse modulation.

Embodiments 5 to 8

Embodiments in which refractive indexes of the second and third semiconductor layers sandwiching the first semiconductor layer therebetween are asymmetric will now be described.

The fundamental structure of each of these Embodiments is as shown in FIG. 3, and specific structures of respective layers are shown in Table 3.

TABLE 3

| Embodiment No. | Substrate 11 | Layer 12 | Channel Depth (μm) | Channel Width (μm) | Thickness (μm) of Thin Region of Layer 12 | Layer 13 | Layer 14 | Layer 15 |
|---|---|---|---|---|---|---|---|---|
| 5 | n-GaAs | n-Ga$_{0.67}$Al$_{0.33}$As | 1.5 | 10 | (relation between thickness and characteristics is shown in Tables 4 and 5) | undoped, Ga$_{0.95}$Al$_{0.05}$As, 0.1 μm thick | Ga$_{1-x}$Al$_x$As, 2 μm thick | GaAs, 1 μm thick |
| 6 | n-GaAs | n-Ga$_{0.7}$Al$_{0.3}$As | 1.5 | 10 | (relation between thickness and characteristics is shown in Tables 4 and 5) | undoped, Ga$_{0.95}$Al$_{0.05}$As, 0.1 μm thick | (relation between thickness and characteristics is shown in Tables 4 and 5) | GaAs, 1 μm thick |
| 7 | n-GaAs | n-Ga$_{0.5}$Al$_{0.5}$As | 1.5 | 10 | 0.7 | undoped, Ga$_{0.95}$Al$_{0.05}$As, 0.1 μm thick | p-Ga$_{0.4}$Al$_{0.6}$As | GaAs, 1 μm thick |
| 8 | Te doped, n-Ga As$_{0.88}$Sb$_{0.12}$ | Te doped, n-Al$_{0.4}$Ga$_{0.6}$As$_{0.88}$Sb$_{0.12}$ | 1.5 | 10 | 1 | undoped, GaAs$_{0.88}$Sb$_{0.12}$ | Ge doped p-Al$_{0.5}$Ga$_{0.5}$As$_{0.88}$Sb$_{0.12}$ | Ge doped, GaAs$_{0.88}$Sb$_{0.12}$ |

In each of Embodiments 5 to 8, the layer 12 is Sn-doped and the carrier concentration is $\sim 10^{18}$ cm$^{-3}$, the layer 14 is Ge-doped and the carrier concentration is $\sim 10^{18}$ cm$^{-3}$ and the carrier concentration in the layer 13 is $\sim 10^{16}$ cm$^{-3}$. The region 18 is a p-type region formed by diffusing Zn in the semiconductor layers 14 and 15 according to a known method. The width of the region 18 in the direction x is 10 μm, and the diffusion depth in the direction y is about 1.5 μm as measured from the boundary between 16 and 18. Reference numerals 16 and 17 represent electrodes composed of, for example, Cr and Au and an Au-Ge-Ni alloy. These laser devices are prepared by a method substantially the same as the method described in Embodiment 1. In order to attain intended compositions in respective layers, amounts of the respective solutions charged and the crystal growing times are appropriately controlled.

In structures of Embodiments 5 and 6, the refractive index, namely the mole fraction of Al, in Ga$_{1-x}$Al$_x$As constituting the semiconductor layer 14, is changed to prepare various semiconductor laser devices. The maximum thickness $t_M$ of the thin region of the semiconductor layer 12 that allows the lasing operation in the stable transverse mode at a current density of up to 2 times the threshold current density in Embodiment 5 or 6 and the threshold current density Jth at that time are shown in Tables 4 and 5. The lasing wave length is 0.83 μm.

TABLE 4

(Embodiment 5)

| Al Mole Fraction, x | Refractive Index of Layer 14 | $t_M$(μm) | Jth(KA/cm²) | Remarks |
|---|---|---|---|---|
| 0.33 | 3.398 | 0.4 | 2.0 ± 1.0 | symmetric structure |
| 0.38 | 3.362 | 0.6 | 2.2 ± 1.0 | |
| 0.41 | 3.343 | 0.8 | 2.3 ± 1.0 | |
| 0.44 | 3.323 | 1.1 | 2.6 ± 1.0 | |
| 0.46 | 3.314 | 1.5 | 2.8 ± 1.0 | |

TABLE 5

(Embodiment 6)

| Al Mole Fraction, x | Refractive Index of Layer 14 | $t_M$(μm) | Jth(KA/cm²) | Remarks |
|---|---|---|---|---|
| 0.30 | 3.418 | 0.5 | 2.0 ± 1.0 | symmetric structure |
| 0.37 | 3.370 | 0.8 | 2.2 ± 1.0 | |
| 0.40 | 3.352 | 1.2 | 2.5 ± 1.0 | |
| 0.41 | 3.343 | 1.6 | 2.7 ± 1.0 | |

From the results shown in Tables 4 and 5, it will readily be understood that the refractive index of the semiconductor layer 12 is made larger than that of the semiconductor layer 14, it is possible to increase the thickness of the semiconductor layer 12. This means that growth of crystals can be remarkably facilitated. Further, good results can be obtained with respect to the reliability. More specifically, at the thermally accelerated aging test conducted at 70° C., the operation can be performed continuously for several hundred hours (40,000 hours calculated as at room temperature).

Figure 9:
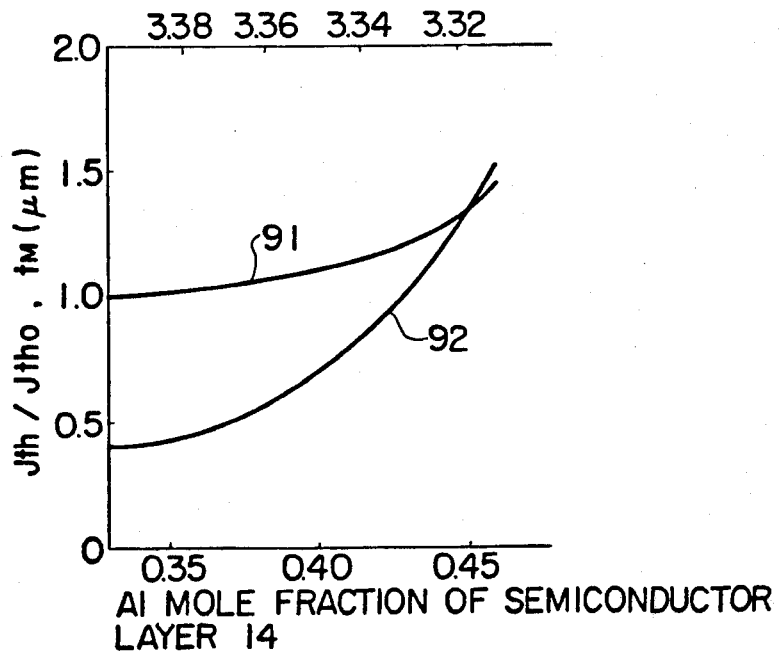
FIG. 9 shows relations of a maximum thickness $t_M$ of a smaller thickness region of the second semiconductor layer and a threshold current density change Jth/Jtho to the refractive index of the third semiconductor layer in a semiconductor laser device of Embodiment 5.
Figure 10:
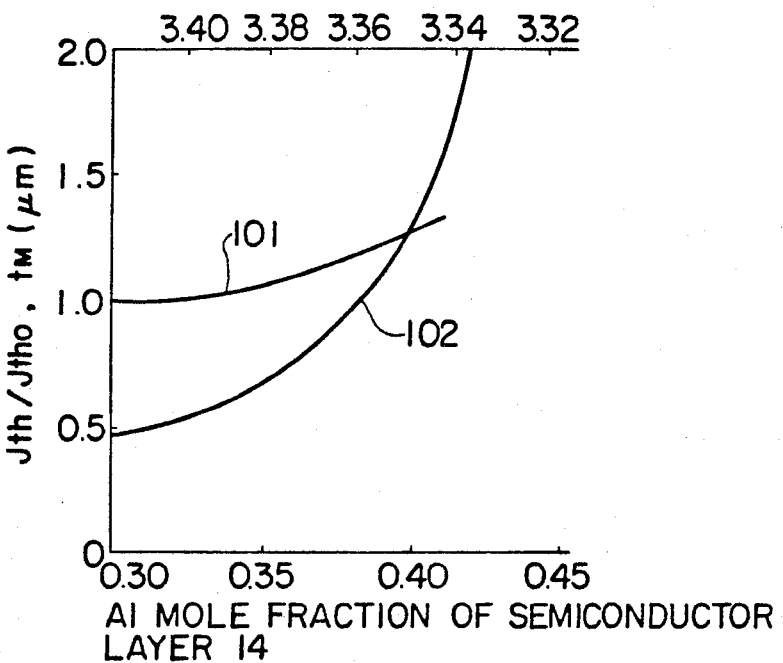
FIG. 10 shows relations of a maximum thickness $t_M$ of a smaller thickness region of the second semiconductor layer and a threshold current density change Jth/Jtho to the refractive index of the third semiconductor layer in a semiconductor laser device of Embodiment 6.

The above maximum time $t_M$ and the change Jth/Jtho (Jtho means the threshold current density attained when the refractive index of the second semiconductor layer is the same as that of the third semiconductor layer) of the threshold current density in Embodiments 5 and 6 is shown in FIGS. 9 and 10 (Each of 91 and 101 represents Jth/Jtho and each of 92 and 102 shows $t_M$). In each of FIGS. 9 and 10, these two factors are shown as functions of the refractive index of the semiconductor layer 14, namely the mole fraction of Al.

In the case where the refractive indexes of the second and third semiconductor layers are rendered asymmetric as in the foregoing Embodiments, it is observed that the threshold current density is slightly increased, but the degree of the increase is within a range of the deviation of the threshold current density in each crystal, and no practical disadvantage is brought about by such increase of the threshold current density.

As will be apparent from the results of the foregoing Embodiments, when the difference of the Al mole fraction x between the semiconductor layers 12 and 14 is about 0.06, the maximum thickness $t_M$ is about 1.5 times the maximum thickness attained when the Al mole fraction x is the same in the layers 12 and 14, and if the difference of x is about 0.085, the maximum thickness is about 2 times. In the practical operation, the difference of x is appropriately determined in view of the desired value of $t_M$ and increase of the threshold current density. From the above results, it is seen that if the difference of x is 0.05 or more, effects are conspicuous.

In Embodiment 7, semiconductor materials to be laminated on the substrate crystal are changed. The lasing wave length is 0.83 μm, and the threshold current density is 1.5 KA/cm². In this Embodiment, $t_M$ can be increased to about 0.7 μm, though $t_M$ is 0.35 μm when the second and third semiconductor layers are composed of the same material, $Ga_{0.5}Al_{0.5}As$.

In Embodiment 8, a semiconductor device is prepared by using materials different from those used in Embodiment 5 as the materials of the substrate crystal and the layers to be laminated thereon. Also in this Embodiment, $t_M$ can be increased to 1 μm though when both the semiconductor layers 13 and 14 are composed of the same material, $Ga_{0.4}Al_{0.6}As_{0.88}Sb_{0.12}$, $t_M$ is 0.5 μm. In this Embodiment, the lasing wave length is 1.1 μm, and the threshold current density is 3KA/cm².

In the foregoing Embodiments, the thickness d of the first semiconductor layer 13 is adjusted to 0.1 μm. As will readily be understood from the illustration given hereinbefore by reference to the formulae (4) and (5), the value d is not limited to a specific value.

Embodiments 9 to 11

Semiconductor laser devices having a principle structure as shown FIG. 3 are prepared, and details of the structures of these devices are shown in Table 6. Devices of these Embodiments are preferred as large output power semiconductor laser devices.

TABLE 6

| Embodiment No. | Substrate Crystal 11 | Layer 12 | Thickness of Thin Portion of Layer 12 | Layer 13 | Layer 14 | Channel Depth (μm) | Channel Width (μm) | Layer 15 |
|---|---|---|---|---|---|---|---|---|
| 9 | n-GaAs, Te doped | n-$Ga_{0.7}Al_{0.3}As$, Sn doped | 0.4 μm | n-GaAs, undoped, 0.1 μm thick | p-$Ga_{0.67}Al_{0.33}As$, 2 μm thick | 1.5 | 20 | n-GaAs, Sn doped, 1 μm thick |
| 10 | n-GaAs, Te doped | n-$Ga_{0.7}Al_{0.3}As$, Sn doped | 0.8 μm | 0.05 μm thick | p-$Ga_{0.67}Al_{0.33}As$, 2 μm thick | 1.5 | 20 | n-GaAs, Sn doped, 1 μm thick |
| 11 | n-GaAs, Te doped | n-$Ga_{0.7}Al_{0.3}As$, Sn doped | 0.5 μm | 0.15 μm thick | p-$Ga_{0.67}Al_{0.33}As$, 2 μm thick | 1.5 | 20 | n-GaAs, Sn doped, 1 μm thick |

The preparation method adopted in Embodiments 9, 10 and 11 is principally the same as the method described in Embodiment 1. In each case, the laser length is 300 μm. In general, in the structure shown in FIG. 3, the width of the region W provides an effective width of the laser. This width is determined based on the lasing operation current and the light output power of the laser. In general, a width of 10 to 20 μm is broadly adopted so as to obtain an output power of ~5 mA at an operation current of 100 to 200 mA.

As a result of our research works, it has been found that when the following arrangement is made in the structure of the semiconductor laser device of the present invention, it is possible to provide a semiconductor laser device having a large output power with a stable lasing mode. In the case of the structure shown in FIG. 3, for example, the width of the channel is adjusted to 10 μm or more (preferably at least 12 μm) and the channel is designed so that the optical loss coefficient in the wave guide of the channel portion is smaller than by at least 40 cm$^{-1}$ than the optical loss coefficient in the wave guide of the adjacent region. Needless to say, in structures other than that shown in FIG. 3, if the above conditions are satisfied, the same effects can be attained equivalently.

Figure 11:
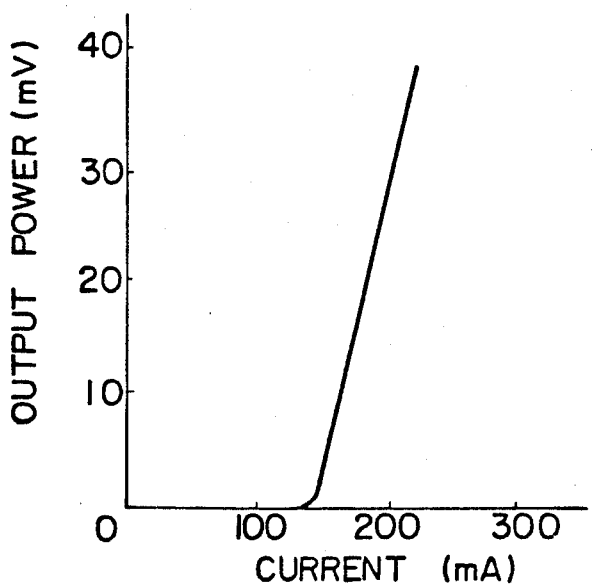
FIG. 11 shows light output versus current characteristics of a semiconductor laser device of Embodiment 9.

The light output power characteristics of the device of Embodiment 9 are as shown in FIG. 11. The lasing wave length is 8800 Å and the threshold current is 75 mA. No kinks appear in the current versus light output power characteristics and light outputs can be stably obtained. The modulation is possible up to 800 Mbits/s. In the laser device of this Embodiment, the difference of the effective absorption coefficient is 200 cm$^{-1}$.

Also in Embodiments 10 and 11, light outputs can be obtained stably when the current density is up to 2 times the threshold current value.

In the semiconductor laser devices illustrated in the foregoing Embodiments, when the threshold current density is set, a current expanded outside the channel and making no contribution to the lasing operation must be taken into consideration. Especially in the case of the structure shown in FIG. 3, in the channel portion, the thickness of the n-Ga$_{1-x}$Al$_x$As layer is increased to 1–1.5 μm. The specific resistivity of this portion is about 0.1 Ω-cm, which is much higher than the specific resistivity of the substrate GaAs, i.e., about 0.003 Ω-cm. Thus, the current tends to flow outside the channel.

Further, in the structure shown in FIG. 3, the thickness of the thin portion of the layer 12 is ordinarily 0.2 to 0.5 μm. In this case, the reliability of the laser device depends greatly on the crystalinity of the substrate crystal, and in order to obtain a laser device having a long life, it is necessary to use a substrate having a low dislocation density and a high crystalinity.

According to a modification of the semiconductor laser device of the present invention, the foregoing defects can be effectively eliminated and there are provided channelled substrate polar laser devices having higher and more preferred characteristics.

According to the above modification attaining the foregoing objects, a fourth semiconductor layer is formed on the semiconductor substrate, and a channel is formed on this fourth conductor layer and respective semiconductor layers are laminated on the channelled fourth semiconductor layer. In this arrangement, if an electric conductivity type opposite to that of the substrate is given to the fourth semiconductor layer, it is possible to cause an electric current to flow preferentially in the channel portion alone. If the electric conductivity type of the fourth semiconductor layer is made identical with that of the substrate and the specific resistivity of the fourth semiconductor layer is made higher than that of the semiconductor in the channel, expansion of the electric current can be reduced. This fourth semiconductor performs a function of a so-called buffer layer and defects are remarkably reduced. Accordingly, long-life laser devices can be obtained in a high production yield.

The foregoing modification of the semiconductor laser device of the present invention will now be described.

Embodiment 12

Figure 12:
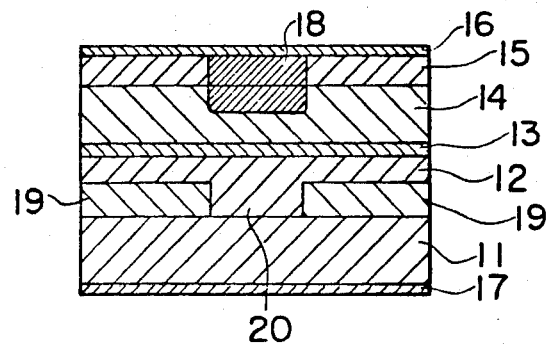
FIG. 12 is a sectional view showing an embodiment of the semiconductor laser device of the present invention which includes a buffer layer.

FIG. 12 illustrates the section of a semiconductor laser device of this Embodiment. A stripe channel 20 is formed on a p-GaAs layer. The structure shown in FIG. 12 is formed in the following manner.

The p-GaAs layer 19 is grown by liquid phase epitaxy or gas phase epitaxy on an n-GaAs substrate (Te-doped, the electron density being ~1×10$^{18}$ cm$^{-3}$) having a crystal face of face index (100). The thickness is 1 to 1.5 μm and the hole density is 1×10$^{17}$ cm$^{-3}$. As an impurity, Ge is used in the case of liquid phase epitaxy or Zn in the case of gas phase epitaxy. A photoresist window having a width of 2 to 20 μm is formed by customary photolithography, and the semiconductor layer 19 is chemically etched through this window to the substrate to form a channel. Then, by successive liquid phase epitaxy, on the so channelled semiconductor layer 19 there are formed a layer 12 of n-Ga$_{1-x}$Al$_x$As (x~0.3, Sn-doped, electron density ~1×10$^{17}$ cm$^{-3}$), an n-GaAs active layer 13 (undoped, electron density ~1×10$^{16}$ cm$^{-3}$), a kayer 14 of p-Ga$_{1-x}$Al$_x$As (Ge-doped, the hole density 5×10$^{17}$ cm$^{-3}$) and an n-GaAs layer 15 (Sn-doped the electron density ~1×10$^{17}$ cm$^{-3}$). The thicknesses of the layers 13, 14 and 15 are about 0.1 μm, about 2 μm and about 1 μm, respectively. The thickness of the thin portion of the layer 12 is about 0.4 μm. Zn is diffused selectively in the region 18 by using an Al$_2$O$_3$ mask. Then, Au-Cr alloy and Au-Ge-Ni alloy are vacuum-deposited to form a positive electrode 16 and a negative electrode 17. Finally, the crystal is cleft to obtain a laser element having a length of 300 μm.

In the above laser device, if the channel width is 10 μm, the lasing operation is possible at a threshold current density of 1.2 KA/cm$^2$ at room temperature. An n-p-n structure is formed in the portion of layers 12, 19 and 11 and no current ineffective for the lasing operation is allowed to flow. Accordingly, the apparent threshold current density can be reduced by about 40%. Further, by introduction of the buffer layer 19, the median life under continuous operation is 80,000 hours at an ambient temperature of 30° C., 4000 hours at 50° C. or 800 hours at 70° C. The output power of the laser at this operation is 3 mW per end face. In the case of a channelled laser of the conventional structure, the median life is 40,000 hours at 30° C., 2000 hours at 50° C. or 500 hours at 70° C. Thus, by adoption of the structure of the present invention, the reliability is enhanced about 3 to about 7 times.

The threshold current density is not so increased even if the channel width W is narrowed, and when the channel width W is 5 μm, the threshold current density is 1.4 KA/cm$^2$. In the case of the conventional structure, if the channel width W is 5 μm, the threshold current density is as high as 3.4 KA/cm$^2$.

Embodiment 13

A laser element is prepared in the same manner as in Embodiment 12 except that the layer 19 in FIG. 12 is composed of n-GaAs (undoped). This layer 19 is grown by liquid phase epitaxy or gas phase epitaxy. The thickness is 1 to 1.5 μm, and the electron density is $10^{15}$ cm$^{-3}$. The specific resistivity is about 1 Ω-cm$^2$.

In this structure, since the resistivity outside the channel is higher than the resistivity of the channel portion, the ineffective current can be remarkably reduced and the threshold current is 1.3 KA/cm$^2$ at room temperature. The reliability is improved in this Embodiment as in Embodiment 12.

Embodiment 14

Figure 13:
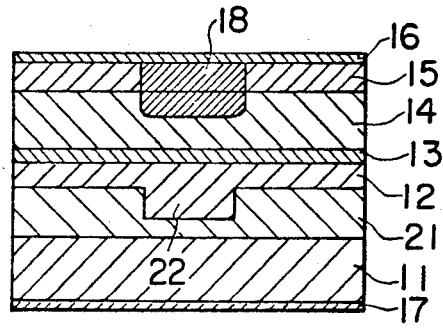
FIG. 13 is a sectional view showing another embodiment of the semiconductor laser device of the present invention in which a channel is formed in the interior of a buffer layer.

The section of a laser device of this Embodiment is shown in FIG. 13. Reference numeral 21 represents an n-GaAs layer (undoped, specific resistivity ∼1Ω-cm$^2$). A channel 22 is formed on a part of the layer 21. Other structural elements are the same as in Embodiment 13. In this Embodiment, the thickness of the layer 21 is adjusted to 1.1 to 3 μm, and the depth of the channel is adjusted to 1 to 1.5 μm so that the bottom of the channel is in the interior of the layer 21. Also in this structure, expansion of the electric current is reduced and the threshold current density is 1.3 KA/cm$^2$ at room temperature. In this structure, if the thickness of the layer 12 below the channel bottom is large, the series resistance of the element is increased. Accordingly, in the case of continuous operation, it is preferred that the thickness of the above portion be smaller than 1 μm.

Embodiment 15

Figure 14:
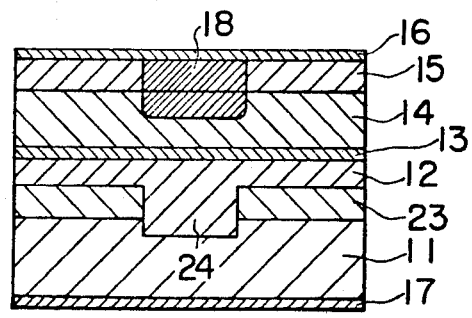
FIG. 14 is a sectional view showing still another embodiment of the semiconductor laser device of the present invention wherein a channel piercing a buffer layer and reaching the substrate is formed.

The section of the laser device of this embodiment is shown in FIG. 14. Reference numeral 11 represents an n-GaAs substrate (Te-doped, electron density ∼$10^{18}$ cm$^{-3}$), reference numeral 23 represents a p-GaAs layer (Ge-doped, hole density ∼5×$10^{17}$ cm$^{-3}$) and reference numeral 24 represents a channel extending to the interior of the substrate. Other structural elements are the same as in Embodiment 12.

In this Embodiment, control of chemical etching for formation of the channel is easier than in Embodiment 12. If the depth of the channel in the substrate is too large, the series resistance of the element is increased. Therefore, it is preferred that the above depth be smaller than 2 μm.

In the laser device of this Embodiment, the threshold current density is 1.2 KA/cm$^2$ at room temperature, and the reliability is improved as in Embodiment 12.

Embodiment 16

A laser device is formed in the same manner as in Embodiment 15 except that the layer 23 is composed of n-GaAs (undoped, electron density ∼1×$10^{15}$ cm$^{-3}$). The threshold current density is 1.3 KA/cm$^2$ at room temperature.

Embodiment 17

Laser elements of the GaAs-GaAlAs series are illustrated in the foregoing Embodiments 12 to 16. Needless to say, the present invention may be applied to other semiconductors.

Figure 15:
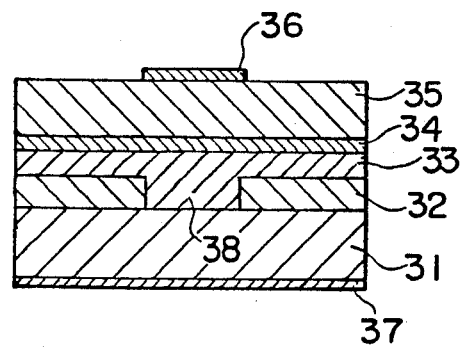
FIG. 15 is a sectional view showing one embodiment of an InP-GaInAsP semiconductor series having the structure of the present invention.

The section of a laser element of Embodiment 17 is shown in FIG. 15. Reference numeral 31 represents an n-InP substrate (Sn-doped, electron concentration ∼2×$10^{18}$ cm$^{-3}$), reference numeral 32 represents a layer of p-Ga$_{0.12}$In$_{0.88}$As$_{0.23}$P$_{0.77}$ (Zn-doped, hole density ∼1×$10^{17}$ cm$^{-3}$), reference numeral 33 represents an n-InP layer (Sn-doped, electron density ∼1×$10^{17}$ cm$^{-3}$), reference numeral 34 represents a layer of Ga$_{0.12}$In$_{0.88}$As$_{0.23}$P$_{0.77}$ (undoped), reference numeral 35 represents a layer of p-InP (Zn-doped, hole density ∼$10^{18}$ cm$^{-3}$), and reference numerals 36 and 37 represent ohmic electrodes. A channel 38 is formed on the layer 32. The thickness of the layer 32 is 1.5 μm, the thickness of the thin portion of the layer 33 is 0.4 μm, the thickness of the layer 34 is 0.1 μm, and the thickness of the layer 35 is 2 μm.

The above laser device is prepared by successive liquid phase epitaxy by using InP as the substrate. The ohmic electrodes are prepared by vacuum deposition of an Au-Zn alloy for a positive electrode and an Au-Sn alloy for a negative electrode.

When the laser length is adjusted to 300 μm, the threshold current density for the lasing operation is 2.3 KA/cm$^2$, which is lower by about 35% than the threshold current density of the conventional laser device of the substrate channelled structure. The median life is 40,000 hours at continuous operation at room temperature, which median life is about 5 times as long as the median life of the conventional structure.

In this Embodiment, p-GaInAsP is used as the buffer layer and the channel bottom is in agreement with the surface of the substrate. It will be apparent that structures corresponding to those of Embodiments 12 to 16 may be adopted in this Embodiment. It will also be apparent that other compound semiconductors such as GaAlAsSb can be similarly employed in the present invention.

In the present invention, it is important that the band gap of the layer formed on the substrate is equal to or smaller than that of the active layer. If only this condition is satisfied, in Embodiment 17, a compound semiconductor consisting of other combination of Ga, In, As and P can be used for the layer 32.

Embodiment 18

In Embodiments 13 and 14, the layer 19 or 21 is composed of n-GaAs (Sn-doped, the electron density being $10^{17}$ cm$^{-3}$). In this structure, an electric current readily flows in portions other than the channel, and the threshold current density for the lasing operation is 2.3 KA/cm$^2$. However, by virtue of the action of the buffer layer, the reliability is improved is highly as in Embodiment 12.

The modification of the semiconductor device of the present invention illustrated in the foregoing Embodiments 12 to 18 is summarized as follows:

1. A semiconductor laser device comprising a fourth semiconductor layer formed on the surface of a semiconductor substrate, a stripe channel formed at least on the surface of said semiconductor layer, and a plurality of semiconductor layers formed on said channel and the surface of said fourth semiconductor layer, one of said plurality of layers being a lasing active layer having a band gap equal to or larger than the band gap of the fourth semiconductor layer.

2. A semiconductor device as set forth in 1 above wherein the electric conductivity type of said fourth semiconductor layer is different from that of the semiconductor substrate and the bottom of the channel reaches the surface or interior of the substrate.

3. A semiconductor laser device as set forth in 1 above wherein the electric conductivity type of the fourth semiconductor layer is the same as that of the semiconductor substrate, the bottom of the channel reaches the surface or interior of the substrate and the specific resistivity of the fourth semiconductor layer is higher than that of the semiconductor present in the channel.

4. A semiconductor laser device as set forth in 1 above wherein the electric conductivity type of the fourth semiconductor layer is the same as that of the semiconductor substrate, the bottom of the channel reaches the surface or interior of the substrate and the specific resistivity of the fourth semiconductor layer is equal to or higher than the specific resistivity of the semiconductor present in the channel.

As will be apparent from the foregoing illustration, if a buffer layer is formed in the semiconductor laser device of the present invention, the threshold current density can be reduced and the reliability can be improved. Accordingly, high practical effects can be attained.

Another modification of the semiconductor laser device of the present invention in which the abovementioned basic structure and modifications are improved so that the lasing operation mode can be further stabilized and a semiconductor laser device capable of much stabilized single fundamental mode operation can be provided.

Figure 16:
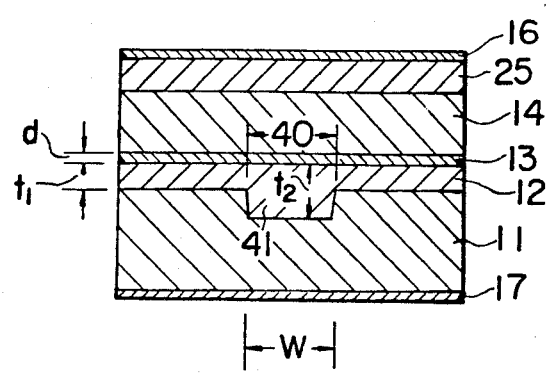
FIG. 16 is a diagram illustrating the structure realizing a single mode lasing operation in the semiconductor device of the present invention.

This modification will now be described by reference to FIG. 16 illustrating an embodiment in which GaAs and GaAlAs are employed.

A channel 41 is formed on an n-GaAs substrate 11 (n-type, electron density $\sim 10^{18}$ cm$^{-3}$). The depth of the channel 41 is, for example, 1 to 1.5 $\mu$m. Reference numeral 12 represents an n-Ga$_{1-x}$Al$_x$As layer (x$\sim$0.3, n-type, density $\sim 10^f$cm$^{-3}$) grown on the channelled substrate. Reference numeral 13 represents an undoped GaAs active layer (n-type, density $\sim 10^{16}$ cm$^{-3}$, thickness $\sim 0.1$ $\mu$m). Reference numeral 14 represents a p-Ga$_{1-x}$Al$_x$As layer (hole density $\sim 5 \times 10^{17}$ cm$^{-3}$, p-type, thickness $\sim 2$ $\mu$m). Reference numeral 25 represents a p-GaAs layer (p-type, density $\sim 10^{18}$ cm$^{-3}$, thickness $\sim 1$ $\mu$m). Reference numerals 16 and 17 represent ohmic electrodes. Light is distributed in the vertical direction in FIG. 16 with the GaAs layer 13 being as the center and is propagated in the direction rectangular to the drawing surface. As pointed out hereinbefore, light is confined in the transverse direction parallel to the junction face. The lasing operation takes places with the active region 40 on the channel being as the center. Accordingly, the spot width of the lased light is substantially equal to the width W of the channel, and the spot width can easily be controlled by changing the width of the channel.

Figure 17:
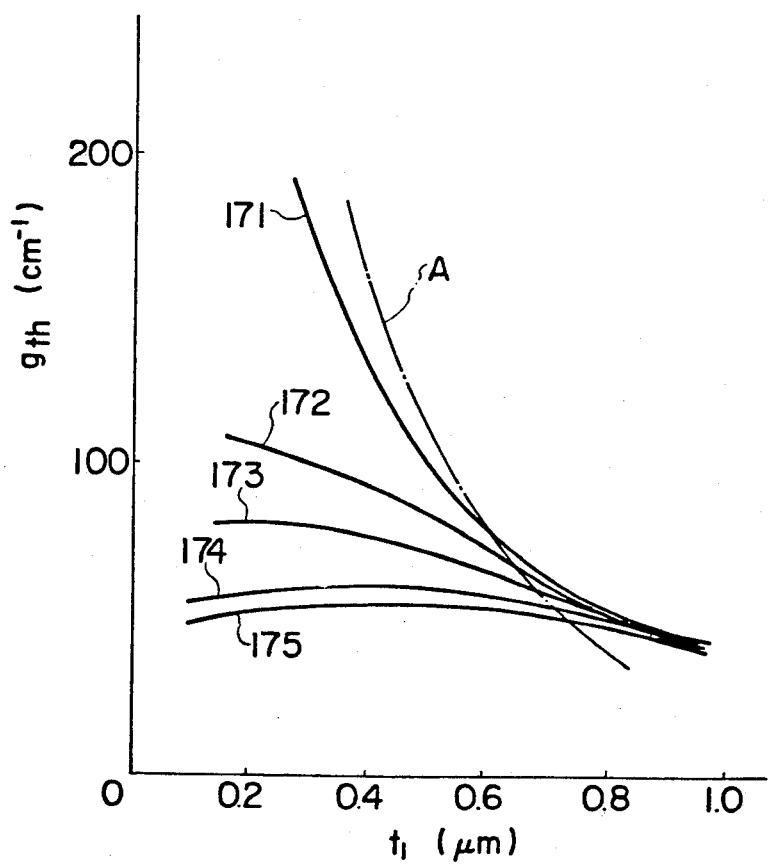
FIG. 17 is a view illustrating the relation between the threshold gain Gth and the thickness $t_1$ of a small thickness region of the second semiconductor layer when the thickness d of the active layer is 0.1 μm, by using the channel width W as a parameter.

The effective absorption coefficient depends greatly on the degree of arrival of light at the substrate, namely the thickness d of the active layer 13 and the thickness t$_1$ of the n-Ga$_{1-x}$Al$_x$As layer, as pointed out hereinbefore. In view of results of experiments made on the conventional double hetero structure, in order to reduce the threshold value for the lasing operation, d is ordinarily adjusted to 0.05 to 0.2 $\mu$m. FIG. 17 illustrates the relation between the thickness t$_1$ of the thin portion of the n-Ga$_{1-x}$Al$_x$As layer and the theoretical value of the threshold gain Gth necessary of initiation of the lasing operation when d is 0.1 $\mu$m. The channel width W is adopted as the parameter. In FIG. 17, curve 171 shows the results obtained when W is 2 $\mu$m, curve 172 shows results obtained when W is 3 $\mu$m, curve 173 shows results obtained when W is 4 $\mu$m, curve 174 shows results obtained when W is 5 $\mu$m, and curve 175 shows results obtained when W is 8 $\mu$m.

In order to prevent the lasing operation from taking place in portions other than the channel, the threshold gain gth must be sufficiently smaller than the threshold gain g°th in the wave guide other than the channel. In general, a relation of g$\infty$J$^{1.5}$ is substantially established between the gain g and the current density J. Accordingly, if it is intended to obtain stable laser operation in the channel at a current density up to 1.5 times the threshold current density Jth, a condition of gth$\leq$0.6g°th must be satisfied. In view of the foregoing, 0.6G°th is indicated by one-dot chain line A in FIG. 17. From FIG. 17, it will be apparent that when W is in the range of from 2 to 8 $\mu$m, sufficiently stable lasing operation can be obtained in the channel portion if the condition of t$_1\leq$0.6 $\mu$m is satisfied.

Figure 18:
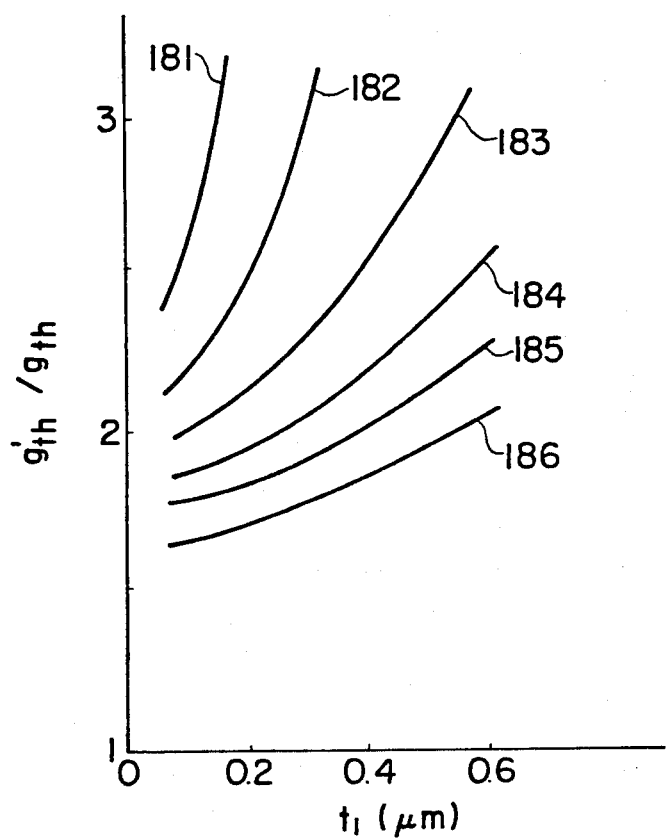
FIG. 18 is a view showing relations of the change of the ratio of the threshold gain F'th of the first order transverse mode operation to the threshold gain Gth of the lowest transverse mode operation to $t_1$ and W when the thickness d of the active layer is 0.1 μm.

In FIG. 18, the ratio of the threshold gain G'th in the first order transverse mode operation to the threshold gain Gth in the lowest transverse mode operation under conditions of d=0.1 $\mu$m and t$_1\leq$0.6 $\mu$m is plotted. The fact that the g'th/gth ratio is high means that the single fundamental mode operation is possible even at a high current density. In FIG. 18, curve 181 shows results obtained when W is 2 $\mu$m, curve 182 shows results obtained when W is 3 $\mu$m, curve 183 shows results obtained when W is 5 $\mu$m, curve 184 shows results obtained when W is 7 $\mu$m, curve 185 shows results obtained when W is 8 $\mu$m, and curve 186 shows results obtained when W is 10 $\mu$m. In the case of W<8 $\mu$m, the relation of g'th/gth$\geq$1.8 is established if t$_1\leq$0.6 $\mu$m. Thus, if this ratio is converted to the current density ratio, it is seen that the lowest transverse mode operation is possible if the current density is up to 1.5 times the threshold current density value. If W is larger than 8 $\mu$m, a higher order mode operation readily occurs.

From the theorectical results shown in FIGS. 17 and 18, it is apparent that in case of d=0.1 $\mu$m and 2 $\mu$m$\leq$W<8 $\mu$m, stable single fundamental transverse mode operation takes place in the channel portion if the condition of t$_1\leq$0.6 is satisfied. When d is other than 0.1 $\mu$m, if the loss in the active region on the protuberance as the wave guide is smaller by at least 40 cm$^{-1}$ than the loss in the wave guide of the adjacent region, substantially same lasing characteristics as described above can be obtained. In short, the problem can be converted to a problem of the wave guide characteristics.

The wave guide characteristics is determined by the effective complex refractive index difference $\delta\tilde{n}$ is written as follows:

$$\delta\tilde{n} = \Delta n + \frac{i}{2k_o}\tilde{\alpha}$$

wherein $\Delta n$ represents the effective refractive index difference, $\tilde{\alpha}$ stands for the effective loss difference and k$_o$ stands for the wave number of lased light in vacuum.

As is well known, $\Delta n$ is substantially in proportions to $\tilde{\alpha}$. Accordingly, in the structure of the present embodiment, the wave guide characteristics can be grasped by determining $\tilde{\alpha}$. The effective loss difference can be expressed as follows:

$$\tilde{\alpha} \approx 2k_o Im\left[\frac{p^2h^2(p+r)e^{-2pt_2}}{\beta_o\left(1+\frac{pt_1}{2}\right)(p^2+h^2)(p-r)}\right] \quad (7)$$

wherein Im ( ) stands for the imaginary part of the portion ( ), $\beta_o$ stands for the light propagation constant in the lengthwise direction of the laser in the channelled region, h stands for the propagation constant in the direction of the thickness of the layer 13 in the region outside the channel, p stands for the damping constant in the direction of the thickness in the layer 13, and r stands for the damping constant in the direction of the thickness in the layer 11.

From the foregoing results, it is conducted that the critical point and range of d=0.1 μm and $t_1 \leq 0.6$ μm in the structure of the present embodiment are well in comformity with $\tilde{\alpha} \geq 40$ cm$^{-1}$. If d becomes large, the light distribution in the vertical direction in FIG. 16 is narrowed. Accordingly, in order to obtain an equivalent effective loss difference, $t_1$ must be made smaller. More specifically, in order to attain $\tilde{\alpha} \geq 40$ cm$^{-1}$, the condition of $t_1 \leq 0.5$ μm must be satisfied in case of d=0.15 μm, and the condition of $t_1 \leq 0.4$ μm must be satisfied in case of d=0.2 μm. If an equivalent effective loss difference is realized in the foregoing manner, similar lasing characteristics can be attained.

This modification of the semiconductor laser device of the present invention will now be described in detail by reference to the following Embodiments.

Embodiment 19

Figure 19:
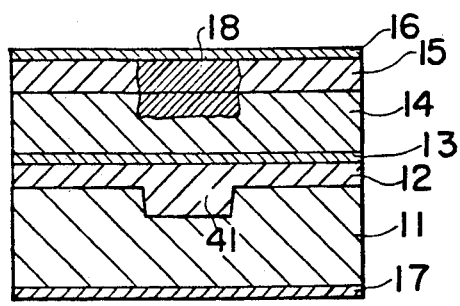
FIG. 19 is a sectional view illustrating an example of the element realizing the single mode lasing operation in the semiconductor laser device of the present invention.

FIG. 19 shows the sectional structure of a laser device of this Embodiment. Reference numeral 15 represents an n-GaAs layer and reference numeral 18 represents a zinc-diffused portion. Other structural elements are the same as in FIG. 16. Various samples are prepared by adjusting the width W of a channel 41 to 5 μm in FIG. 19 and changing the thickness d of the active layer and the thickness $t_1$ of the layer 3. A structure as shown in FIG. 19 is prepared in the following manner.

A photoresist window having a width of 5 μm is formed on an n-GaAs substrate (Te-doped) having a face of face index (100) by customary photolithography, and the surface of the substrate is chemically etched through this window to form a channel having a depth of 1.5 μm. Semiconductor layers 12, 13 and 14 shown in FIG. 19 are formed on the so channelled substrate according to customary successive liquid phase epitaxy. The thicknesses d and $t_1$ are controlled by controlling the growth times according to customary procedures. Then, an Al$_2$O$_3$ film is formed and a window having a width of 5 μm is formed thereon according to photolithography. Zinc is diffused through this window to form a p-type diffusion region 18. Au-Cr alloy and Au-Ge alloy are vacuum-deposited to form ohmic electrodes 16 and 17, respectively. Finally, the crystal is cleft to form a reflector, whereby a laser element having a laser length of 300 μm is prepared.

Figure 20:
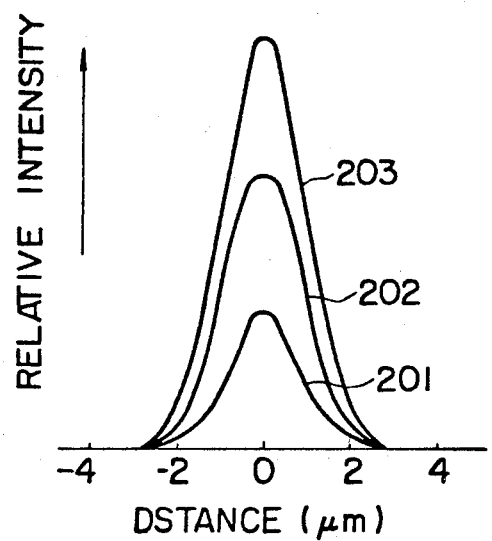
FIG. 20 shows the near field intensity profile of the semiconductor laser device shown in Embodiment 19.

In the above semiconductor laser element, in case of d=0.1 μm and $t_1$=0.5 μm, the threshold current density is ~2.2 KA/cm$^2$ at room temperature. FIG. 20 illustrates the near field intensity profile of the lasing operation in the direction x. The intensity profile is determined with respect to the direction parallel to the junction face on the cleft face. The lasing operation is of the single transverse mode, and this operation mode is stable when the current value is up to two times the threshold value (up to 130 mA). In FIG. 20, I/Ith is used as the parameter (curve 201: I/Ith=1.1, curve 202: I/Ith=1.5, curve 203: I/Ith=2).

Figure 21:
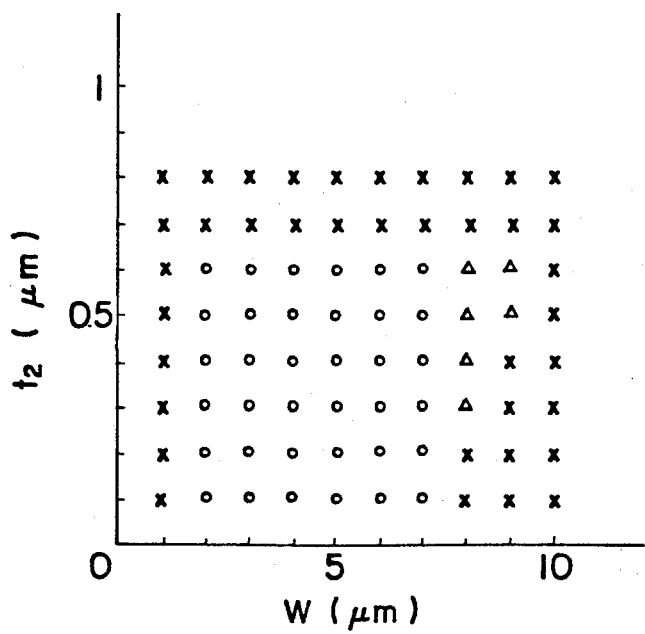
FIG. 21 shows results of evaluation of the stability of the lasing mode of the semiconductor device of the present invention in which d is 0.1 μm, $t_1$ is in the range of from 0.1 to 0.8 μm and W is in the range of from 1 to 10 μm.

FIG. 21 shows results of tests of the stability of the lasing operation mode made on elements in which d is fixed to 0.1 μm, $t_1$ is changed in the range of from 0.1 to 0.8 μm and W is changed in the range of 1 to 10 μm. In FIG. 21, symbol O indicates that the single transverse mode operation is possible when the current is up to 1.5 times the threshold value, symbol X indicates that a higher order mode operation takes place even if the current is lower than 1.5 times the threshold value, and symbol Δ indicates that the single transverse mode operation is slightly unstable. From the results shown in FIG. 21, it is seen that the single transverse mode operation is always possible if conditions of 2 μm $\leq$ W < 8 μm and $t_1 \leq 0.6$ μm are satisfied. As illustrated hereinbefore, the value of $t_1$ is determined by the optical loss in the wave guide.

Embodiment 20

In FIG. 19, the thickness d of the active layer is adjusted to 0.05 μm or 0.15 μm, and other structural elements and preparation procedures are the same as described in Embodiment 19. Also in this Embodiment, when the channel width is at least 2 μm but smaller than 8 μm, if the loss in the semiconductor layer having a protuberance as the wave guide is smaller by at least 40 cm$^{-1}$ than the loss in the wave guide in the adjacent region, stable single transverse mode operation can be obtained at a current up to 1.5 times the threshold value. For example, if d is 0.05 μm, if d is 0.05 μm, the above condition is satisfied in case of $t_1 \leq 0.8$ μm, and when d is 0.15 μm, the above condition is satisfied in case of $t_1 \leq 0.5$ μm.

In the foregoing Embodiments, GaAs and GaAlAs semiconductors are employed. However, it is apparent that in the present invention directed to a laser device including a wave guide, materials of semiconductors are not critical. Accordingly, other semiconductor materials, for example, three-element type compound semiconductors such as GaInP, GaAsP and GaAlSb and four-element type compound semiconductors such as GaInAsP and GaAlAsSb, can be similarly used for the semiconductor laser device of the present invention.

Needless to say, the present modification of the semiconductor laser device is not limited to the structures shown specifically in the foregoing Embodiments 19 and 20, but this modification can be applied to any of the structures in which arrangement requirements of this modification are satisfied.

In semiconductor laser devices represented by a channelled substrate planar laser, if the width of the lasing channel and the effective loss difference are adjusted according to the present modification of the present invention, stable signal transverse mode operation becomes possible. Accordingly, the practical effects of the present modification are extremely high.

As pointed out hereinbefore, the wave guide characteristics are determined by the composite refractive index difference $\delta \tilde{n}$ between the channelled portion and the non-channelled portion, which difference is expressed as follows:

$$\delta \tilde{n} = n + \frac{i}{2k_o} \tilde{\alpha}$$

In the foregoing Embodiments, the refractive index difference is realized in the transverse direction of the first semiconductor layer (active layer) mainly by changing the effective loss corresponding to the imaginary part of the composite refractive index. However, the optical gain or loss difference can be realized in the transverse direction of the first semiconductor layer (active layer) by changing the effective refractive index corresponding to the real part of the composite refractive index while regarding the effective loss (imaginary part) as being zero.

For example, in semiconductor laser devices shown in FIGS. 12, 13 and 14, if $Ga_{1-p}Al_pAs$ ($y<p\leq 1$, $p\neq x$) is used as the fourth semiconductor layer 19, 21 or 23, the composite refractive index difference can be brought about based on the effective refractive index difference, whereby the optical gain or loss can be changed and light can be confined in the transverse direction in the active region. $Ga_{1-p}Al_pAs$ includes two types, namely the type of $p>x$ and the type of $p<x$. In each case, the same effects can be attained.

We succeeded in preparing semiconductor laser devices having good current versus light output power characteristics by using $Ga_{0.8}Al_{0.2}As$ or $Ga_{0.5}Al_{0.5}As$ as the layer 19, 21 or 23.

In the foregoing Embodiments, elements in which a stripe protuberance is formed on the second conductive layer 12 are illustrated. Semiconductor laser devices of the present invention can be prepared by forming a protuberance on the third semiconductor layer 14. More specifically, if the thicknesses $t_5$ and $t_6$ of the third semiconductor layer 14 are adjusted as in the foregoing Embodiments as shown in FIG. 22, a difference of the optical gain or loss is brought about in the direction x of the lasing active layer 13, and the region below the protuberance 42 of the first semiconductor layer acts as a lasing active region and a semiconductor laser device having good light output versus current characteristics can be provided.

Figure 22:
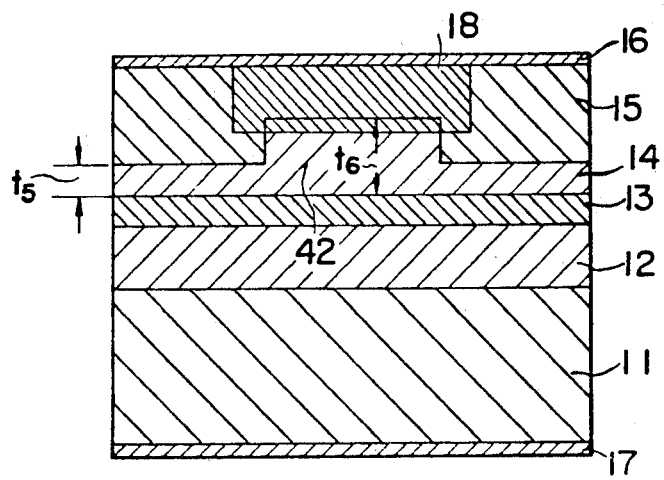
FIG. 22 is a sectional view showing an example of the element in which a thick portion and a thin portion are formed on the third semiconductor layer.

In the semiconductor laser device shown in FIG. 22, n-GaAs is used as the substrate 11, n-$Ga_{0.7}Al_{0.3}As$ having a thickness of 2 μm is used as the second semiconductor layer 12, updoped $Ga_{0.95}Al_{0.05}$ having a thickness of 0.1 μm is used as the first semiconductor layer 13, p-$Ga_{0.7}Al_{0.3}As$ ($t_5=0.4$ μm, $t_6=1.5$ μm) is used as the third semiconductor layer 14, and n-GaAs is used as the semiconductor layer 15. Reference numeral 18 represents a p-type Zn-diffused layer, reference numeral 16 represents a positive electrode of Au-Cr, and reference numeral 17 represents a negative electrode of an Au-Ge-Ni alloy. In this structure, good results are obtained.

It is possible to combine structures shown in FIGS. 22 and 3. More specifically, it is possible to form a thick portion and a thin portion in each of the second semiconductor layer 12 and the third semiconductor layer 14.

Any of materials having a composite refractive index difference from that of the semiconductor layer 14 with respect to the guided lased wave may be used as the layer 15 instead of a semiconductor. For example, the light absorbing effect of metals such as Au can be utilized. Of course, materials other than semiconductors can be used as the substrate 11 in the structure shown in FIG. 3 and layers 19, 21 and 32 in structures showns in FIGS. 12 to 15.

In semiconductor laser devices illustrated in the foregoing embodiments, on the channel portion (or the protuberant portion) formed on the substrate or the semiconductor layer formed on the substrate, the second semiconductor layer having a plane surface covering said channel or protuberant portion is present, and also the active layer (the first semiconductor layer) formed on the second semiconductor layer is a flat layer. Even if the active layer is protruded along the channel or protuberant portion, a semiconductor laser device equivalent to the wave guide structure shown in FIG. 4 can be obtained. This modification will now be described.

Figure 23:
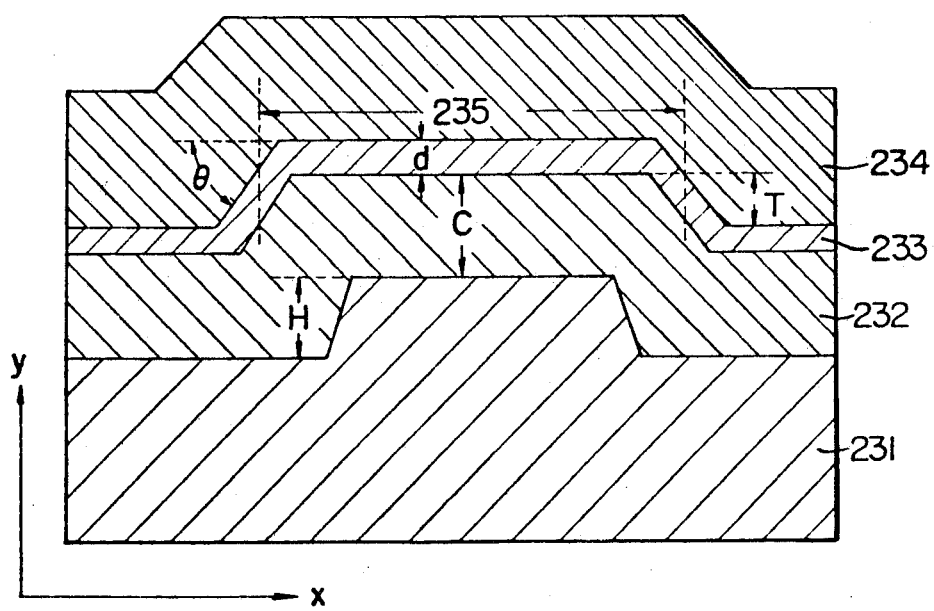
FIG. 23 is a sectional view illustrating a semiconductor laser device in which the refractive index is changed in the transverse direction of the active region by curving the active layer.

Referring now to FIG. 23, double hetero junction crystal layers are grown by the epitaxial method on a substrate 231 having a stripe channel or stripe projection (projection in FIG. 23) extending in the direction z. A layer 233 is composed of a first semiconductor crystal, and layers 232 and 234 are composed of second and third semiconductor crystals, each having a band gap broader than that of the first semiconductor crystal and a refractive index smaller than that of the first semiconductor crystal. It is possible to omit provision of the layer 232 by using the second semiconductor for the substrate 231. Instead of a single crystal layer, a multilayer structure including a plurality of layers epitaxially grown, which is etched to form a channel or projection, may be used as the substrate 231. In other words, the crystal of the projection (or the protuberant portion surrounding the channel) may be different from the crystal of the substrate 231. In short, the semiconductor laser device according to the present modification of the present invention is characterized in that a projection or channel is formed on the substrate and the first semiconductor layer 233 is protruded along the projection or channel on the substrate.

Figure 24:
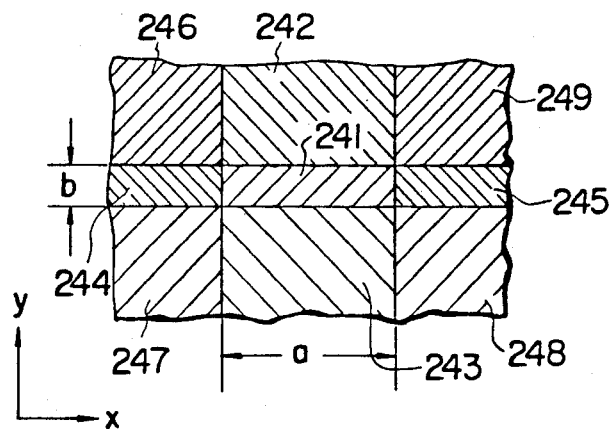
FIG. 24 is a view illustrating the light wave guide structure of the semiconductor laser device shown in FIG. 23.

According to the theoretical analysis of a dielectric rectangular wave guide, the section of which is illustrated in FIG. 24, electromagnetic wave propagation characteristics along the region 241 are approximately determined by the refractive index, width a and thickness b of the region 241 and the refractive indexes of regions 242, 243, 244 and 245 but they do not depend on characteristics of regions 246, 247, 248 and 249. This approximation is established except the case where both a and b are simultaneously smaller than the wave length $\lambda_g$ of the guided light in the wave guide. In ordinary semiconductor lasers, the relation of $a >> \lambda_g$ is established and good approximation is observed.

Referring to FIG. 23, the light propagated in the region 235, i.e., a part of the layer 233 composed of the first semiconductor, is equivalent to the light propagated in a rectangular wave guide, the lower portion of which is defined by the second semiconductor and the left and right sides and upper portion of which are defined by the third semiconductor, and if the region 235 is excited, stabilized transverse mode operation can be obtained.

In order to bring about the above-mentioned difference of the refractive index effectively in the direction x, the protuberant height T of the protuberant portion must be larger than the light penetration depth r in the direction y from the active region 235, and this penetration depth r is given by the formula (1) as pointed out hereinbefore.

In an ordinary laser element of the GaAs-GaAlAs series, the value of r is about 0.3 μm. Accordingly, if the condition of $T>0.3$ μm is satisfied, a semiconductor laser element having a guide wave structure shown in FIG. 24 is provided.

In a laser element having a structure shown in FIG. 23, in order to change the refractive index in the horizontal direction in the region 235, the protruberant incline angle $\theta$ must be larger than the critical angle $\alpha$. In this case, a semiconductor laser element having a wave guide structure shown in FIG. 24 is provided effectively. This critical angle α is expressed as follows:

$$\alpha° = 90° - \beta° - 90° - \sin^{-1}\frac{n_{15}}{n_{14}}$$

In case of semiconductor lasers of the GaAs-GaAlAs series, if the condition of $\theta \geq 20°$ is satisfied, sufficient effects can be expected. It also is important that the thickness c of the layer 232 below the lasing active region 235 must be sufficiently larger than the penetration depth r (in order to prevent absorption of light by the substrate). Sufficient results are obtained when the thickness c is larger than 1 μm. Similarly, the thickness of the layer 15 must be larger than 1 μm. If the height H of the projection (or the channel) is too large, continuous junctions are not formed among the layers 13, 14 and 15, and if the height H is too small, no effective refractive index difference is brought about. Accordingly, it is preferred that the height H be 2 to 4 μm.

When the respective layers are grown on the substrate by successive liquid phase epitaxy, if the growing temperature is adjusted to 730° to 780° C. and the temperature lowering rate is adjusted to 1° to 5° C./min, the projection channel or channel on the substrate can be transferred substantially precisely onto the first semiconductor layer, i.e., the lasing active layer, and the protuberant incline angle θ in the laser active layer is about 20° more.

It has been found that dimensions substantially the same as described above are suitable for laser elements of the GaAsSb series and of the GaInAsP-InP series.

As will be apparent from the foregoing illustration, the present modification is characterized in that in a first semiconductor layer where lasing operation is caused, a protuberant portion is formed between a region excited mainly by a current from an electrode disposed along the propagation direction of lased light and other region, and by virtue of this characteristic structure, the following effects can be attained:

(1) From the optical viewpoint, there can be obtained a stable transverse mode operation equivalent to the transverse mode operation attained when the entire periphery of the first semiconductor is surrounded by the second or third semiconductor.

(2) In connection of the manufacture process, the semiconductor laser element can be prepared by one successive epitaxy and crystal growth can be controlled effectively. Thus, the process steps can be simplified and a product having a high reliability can be obtained without introduction of crystal defects.

This modification will now be described in detail by reference to the following Embodiments.

Embodiment 21

Figure 25:
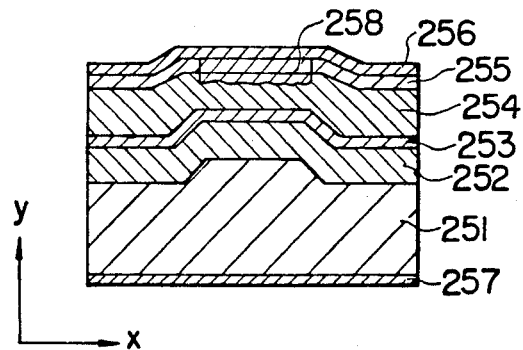
FIG. 25 is a sectional view showing an embodiment of the semiconductor laser device in which the optical confinement is attained in the transverse direction of the active region by curving the active layer.

The section of a semiconductor laser device of this Embodiment is shown in FIG. 25. This laser device is prepared in the following manner.

A photoresist stripe having a width of 10 μm is formed by photolithography on an n-GaAs substrate (Te-doped, concentration ∼10$^{18}$cm$^{-3}$) having a crystal face of face index (100), and the substrate is chemically etched along a depth of about 3 μm by using the so formed stripe as a mask to thereby form a substrate 251 having a protuberant surface. The direction of the stripe is in agreement of [011] and a 1:1:3 liquid mixture of $H_3PO_4:H_2O_2:C_2H_4(OH)_2$ is used for the etching treatment. Layers 252, 253, 254 and 255 are formed on the substrate by customary successive liquid phase epitaxy. Compositions of solutions used for formation of these layers are as follows:

(1) First Layer 252 ($Ga_{0.7}Al_{0.3}As$): 4 g of Ga, 3 mg of Al, 200 mg of Sn and 200 mg of GaAs
(2) Second layer 253 ($Ga_{0.97}Al_{0.03}As$): 4 g Ga, 0.2 mg of Al and 200 mg of GaAs
(3) Third layer 254 ($Ga_{0.7}Al_{0.3}As$): 4 g of Ga, 3 mg of Al, 70 mg of Ge and 200 mg of GaAs
(4) Fourth Layer 255 (GaAs): 4 g of Ga, 100 mg of Sn and 200 mg of GaAs An ordinary sliding boat is used for liquid phase epitaxy, and the solution is saturated at 760° C. and cooled at a temperature-lowering rate of 3° C./min. Growth is started at 740° C. The growth times for the layers 252, 253, 254 and 255 are 3 minutes, 3 seconds, 3 minutes and 1 minute, respectively, and the thicknesses of these layers are 1.5 μm, 0.2 μm, 2 μm and 1 μm, respectively. The thickness t is about 1 μm. As additive impurity, Sn is used for the n-type and Ge is used for the p-type. Then, an $Al_2O_3$ film is formed on the surface and a window having a width of 7 μm is formed at a position corresponding to the protuberant portion, and Zn is selectively diffused up to the layer 244 through this window and the $Al_2O_3$ film is then removed. Positive and negative electrodes spaced by 300 μm from each other are formed by vacuum deposition, and the crystal face is cleaved at (011), whereby a laser element is prepared. A Cr-Au alloy is used for the positive electrode and an Au-Ge-Ni alloy is used for the negative electrode.

Figure 1B:
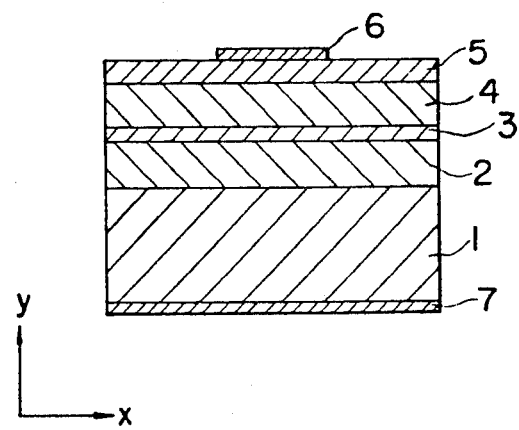
Figure 26:
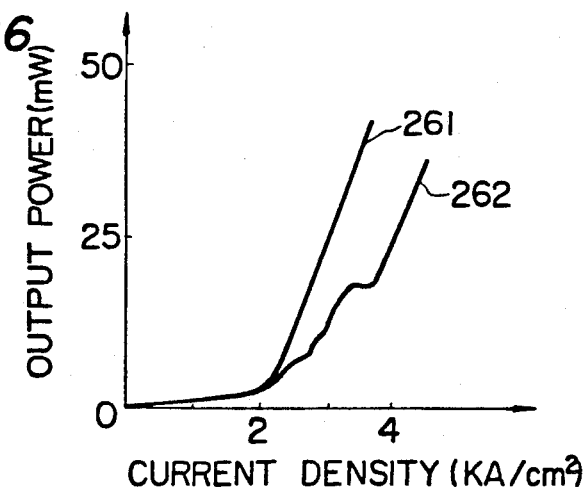
FIG. 26 shows light output versus current characteristics of the semiconductor laser device of Embodiment 21.
Figure 27A:
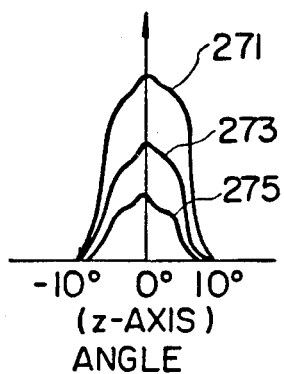
FIG. 27-a shows the far field intensity profile in the x-z face of the semiconductor laser device of Embodiment 21.
Figure 27B:
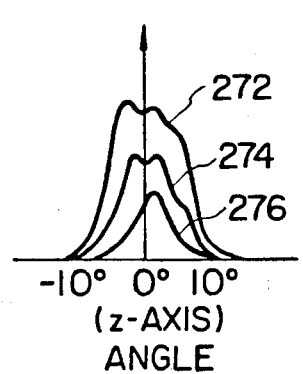
Figure 28:
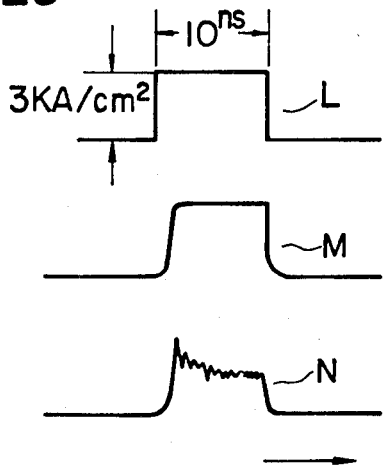
FIG. 28 shows light outputs obtained when the semiconductor laser device shown in FIG. 25 and the semiconductor laser device shown in FIGS. 1-a and 1-b are excited by pulsated currents.

The lasing operation characteristics of the so prepared laser device and the conventional laser device shown in FIGS. 1-a and 1-b as the comparative element are shown in FIGS. 26 to 28. FIG. 26 illustrates the relation between the exciting current and the light output power. Curve 261 shows results of the laser device of the present invention shown in FIG. 25, and curve 262 shows results of the conventional structure shown in FIGS. 1-a and 1-b. In the laser device of the present invention, the threshold current density for the lasing operation is about 2 Ka/cm$^2$. It is seen that the linearity of the relation between the current and the output power is highly improved in curve 261 over in curve 262.

FIGS. 27-a and 27-b illustrate the far field intensity profile in the x-z face. FIG. 27-a shows results of the structure of the present invention shown in FIG. 25 and FIGS. 27-b shows results of the conventional structure shown in FIGS. 1-a and 1-b (curves 271 and 272: exciting current of 4 KA/cm$^2$, curves 273 and 274: exciting current of 3.3 KA/cm$^2$, curves 275 and 276: exciting current of 2.5 KA/cm$^2$). It is seen that in FIG. 27-a, the intensity profile is irregularly changed depending on the change of the exciting current but in FIG. 27-a, the intensity profile is much stabilized.

FIG. 28 illustrates the output power obtained when the element is excited by a pulsating current L having an amplitude of 10 ns. Curve M shows results of the structure shown in FIG. 25 and curve N shows results of the structure shown in FIGS. 1-a and 1-b. In curve N, irregular changes of the output power are observed, but in curve M, such changes are not observed at all. The life of the laser device shown in FIG. 25 is more than 5000 hours at an output power of 5 mW and is equivalent to the life of the laser device shown in FIGS. 1-a and 1-b.

The foregoing results are those obtained with respect to the structure where the substrate has a protuberant surface. Also in case of the structure where the substrate has a caved surface, similar results are obtained.

In this Embodiment, since the width of the stripe is adjusted to about 10 μm, a higher order mode lasing operation as shown in FIG. 27-a is caused. In order to obtain the lowest mode lasing operation, it is necessary that the stripe width must be not larger than 2 μm. In this case, the lasing area is reduced and there is brought about a disadvantage that a large output power can hardly be obtained. In the present modification of the present invention, as will be apparent from Embodiments given hereinafter, it is possible to obtain a lower order mode lasing operation without reduction of the lasing area.

Embodiment 22

Figure 29:
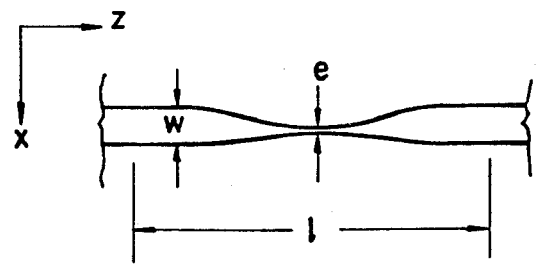
FIG. 29 is a diagram illustrating the concept of a semiconductor laser device in which the width of a stripe channel or protrusion is changed.

FIG. 29 illustrates the shape of a stripe formed on the surface of a substrate in Embodiment 22. Etching is carried out so that a caved strip is formed. The width of the stripe is gradually changed from w=20 μm to e=5 μm. On this substrate, respective layers are formed in the same manner as described in Embodiment 21. Both the ends are cleft with a spacing l of 300 μm therebetween. The far field intensity profile in the face x-z in the so prepared laser element is shown in FIG. 30. As is seen from FIG. 30, the laser operation obtained is of the lowest transverse mode and is very stable against the change of the exciting current (curve 301: 3.5 KA/cm$^2$, curve 302: 3 KA/cm$^2$, curve 303: 2.5 KA/cm$^2$). Other characteristics are substantially the same as those obtained in Embodiment 21.

Incidentally, the stripe shape shown in FIG. 29 can be applied to not only the semiconductor laser structures of the present invention but also other various semiconductor laser structures.

Embodiment 23

The shape of a stripe on the surface of a substrate in Embodiment 23 is shown in FIG. 31. The stripe width w is adjusted to 20 μm and the stripe is gradually curved. The length f is adjusted to 20 μm. Other structural elements are the same as in Embodiment 22, and the laser device is prepared according to the same method as described in Embodiment 22. Characteristics of the laser device obtained in this Embodiment are substantially the same as those of the laser device obtained in Embodiment 22. A stable transverse mode lasing operation is obtained.

The stripe shape shown in FIG. 31 as well as that shown in FIG. 29 can be applied to not only the semiconductor laser structures of the present invention but also other various semiconductor laser structures.

Embodiment 24

The section of a laser element of this Embodiment is shown in FIG. 32. The width of a stripe on the surface of a substrate is adjusted to 5 μm. When the growth speed is maintained at a relatively low level at successive liquid phase epitaxy, by the dependency of the growth speed on the face direction, the thickness of a layer 253 is increased on both the sides as shown in FIG. 32. When the growth temperature is 750° C., the temperature-lowering rate is adjusted to 0.2° C./min and the mesa height of the substrate is adjusted 5 μm, the thickness of the layer is 0.2 μm in the central portion and 1 μm in both the side portions.

The near field intensity profile in the direction x in the wave guide of the above laser structure is shown in FIG. 33-a. FIG. 33-b shows the near field intensity profile in the direction x in the wave guide of the buried hetero structure injection laser shown in FIG. 2 (Journal of Applied Physics, 45, No. 11, pp. 4899–4906). If the thickness of the layer 253 is larger than 0.1 μm, the optical gain is in inverse proportion to this thickness. Accordingly, the optical gain is larger in the central portion in the above structure. Therefore, even if the effective width of the wave guide region in the layer 253 is as broad as about 10 μm, the lowest mode operation (m=0, m indicating the number of the order of the mode) can be obtained stably. If the width is larger than 10 μm, a higher order (m=6 in FIG. 33-a) mode operation is caused. In the structure shown in FIG. 32, however, the intensity of the output power is highest in the central portion, and a light output power can be effectively introduced to other optical system such as optical fibers. In FIGS. 33-a and 33-b, g corresponds to the width of the wave guide region. On the other hand, in the burried hetero structure injection laser, the thickness of the layer 3 is uniform and hence, the optical gain is uniform throughout the layer 3. Accordingly, in order to obtain the lowest mode lasing operation, the width of the wave guide region must be smaller than 2 μm. If the width is larger than 2 μm, a higher order mode lasing operation is caused. The case of m=6 is shown in the drawing.

Figure 2:
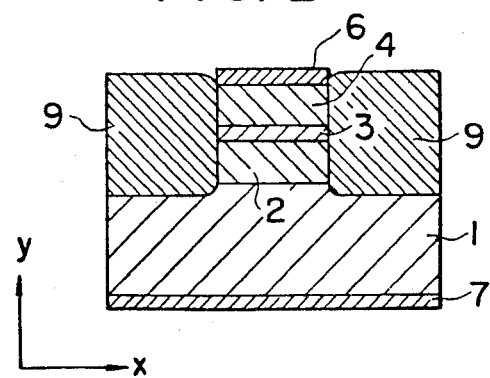
FIG. 2 is a sectional view of a buried hetero structure injection laser.

In the case where the light output powers of the laser of the present invention shown in FIG. 32 and of the burried hetero structure injection laser shown in FIG. 2, which are obtained by a higher order mode lasing operation of m=6, are introduced into the same multimode operation optical fibers through a cylindrical lens, the coupling efficiency is 45% in case of the above structure of the present invention and 18% in case of the burried hetero structure injection laser.

Embodiment 25

Figure 34:
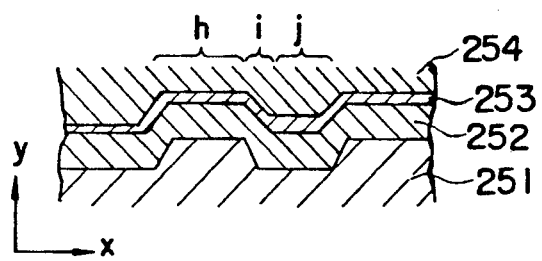
FIG. 34 is a sectional view showing an embodiment in which a plurality of semiconductor laser devices shown in FIG. 25 are connected to one another.
Figures 35A, 35B:
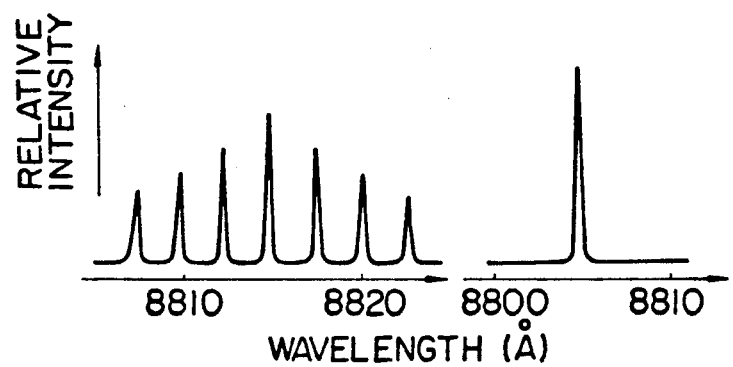
FIG. 35-a illustrates lasing spectra of semiconductor laser devices of Embodiments 21 to 24.

A part of the section of a laser element of Embodiment 25 is shown in FIG. 34. Structural elements other than those shown in FIG. 34 are the same as in Embodiment 21. Excitation is effected on regions h, i and j of a layer 253. In this structure, the wave guide consisting of the region h is weakly coupled with the wave guide consisting of the region j through the region i. Since the thickness of the region h is different from that of the region j, the corresponding propagation constants are different from each other. Accordingly, the laser shown in FIG. 34 can be regarded as a composite laser device provided with a plurality of laser elements. In case of single element lasers shown in Embodiments 21 to 24, since there are present z axis modes having an approximate wave length, the lasing operation spectrum is as shown in FIG. 35-a and the singularity is not good (multi-axis mode lasing operation). On the other hand, in the laser structure of this Embodiment, it is possible to make only one lasing operation present in a gain spectrum, and as is seen from the lasing operation spectrum shown in FIG. 35-b, the singularity is highly improved.

In the foregoing Embodiments, substrates having a crystal face of face index (100) are used, but substrates having a crystal face of face index (110) or (111) can similarly be used. Further, in the foregoing Embodiments, semiconductors of the GaAs-GaAlAs series are used, but needless to say, semiconductors of other series can be used. An Embodiment in which semiconductors or the InP-GaInAsP series will now be described.

Embodiment 26

Figure 36:
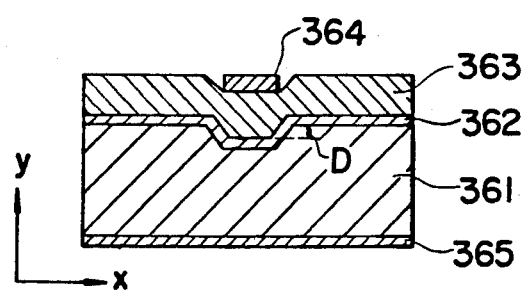
FIG. 36 is a sectional view of an embodiment of the semiconductor laser device of the InP-GaInAsP series having a curved active layer.

The section of a semiconductor laser device of Embodiment 26 is shown in FIG. 36. Reference numeral 361 represents a p-InP substrate (Zn-doped, concentration $\sim 1 \times 10^{18}$ cm$^{-3}$) having a face (111)B. A layer 362 of n-Ga$_{0.1}$In$_{0.9}$As$_{0.2}$P$_{0.8}$ having a thickness of 0.5 µm and a layer 363 of n-InP having a thickness of 2 µm are grown on the substrate 361 by liquid phase epitaxy. Sn is used as an n-type impurity. Negative and positive electrodes 364 and 365 are formed by vacuum deposition of an Au-Ge-Ni alloy and a Cr-Au alloy, respectively. Other preparation procedures are the same as described in Embodiment 21.

In the so prepared laser device, a laser operation can be obtained at a current density of 2.5 KA/cm$^2$ at room temperature. The wave length is 1.1 µm. The stability of the transverse mode lasing operation is substantially the same as in Embodiment 21.

In the foregoing Embodiments 21 to 26, so-called Fabry-Pérot type semiconductor lasers are illustrated. The modification of the present invention illustrated in these Embodiments can be applied not only to distribution feedback type lasers having a built-in diffraction lattice but also to dye lasers and solid layers. Furthermore, the structure of this modification of the present invention can be used as a wave guide or optical element when an optical integrated circuit is formed.

As is apparent from the foregoing illustration, the laser device of the present modification characterized by a curved lasing active region formed on a substrate having a stripe channel or protrusion has various characteristic advantages such as stable transverse mode lasing operation. Further, it can be manufactured very simply with high reproducibility and it is excellent in life and reliability. Thus, the laser device of the present modification of the present invention has very high practical effects.

What is claimed is:

1. In a semiconductor laser device comprising a semiconductor body of a first conductivity type having a major surface and a plurality of contiguous semiconductor layers disposed on said major surface of said body, said plurality of contiguous semiconductor layers being comprised of:
   (i) a first semiconductor layer having a laser active region, a pair of end surfaces parallel to each other so as to form a cavity resonator, and two opposite plane surfaces, a first surface of which faces towards said major surface of said body and second surface of which faces away from said major surface of said body,
   (ii) a second semiconductor layer disposed on said first surface, comprised of a material having a band gap broader than that of said first semiconductor layer,
   (iii) a third semiconductor layer disposed on said second surface disposed on said second surface comprised of a material having a band gap broader than that of said first semiconductor layer, wherein said second and third semiconductor layers have a thickness larger than a distance r in which an evanescent wave along said first surface decays by 1/e, and further wherein said second semiconductor layer has a protrusive portion jutting out toward said first semiconductor layer, said first semiconductor layer covering said second semiconductor layer is protruberant along said protrusive portion of said second semiconductor layer, and said third semiconductor layer covering said first semiconductor layer is protuberant along the protrusive portion of said first semiconductor layer.

2. A semiconductor layer device according to claim 1 wherein said semiconductor body has a projection on said major surface, and said protrusive portion of said second semiconductor layer is protuberant along said projection of said body.

3. A semiconductor laser device according to claim 1 wherein the protuberant height T of said first semiconductor layer is larger than the distance r in which the evanescent wave decays by 1/e.

4. A semiconductor laser device according to claim 1 wherein a protuberant incline angle $\theta$ is as large as a critical angle of the laser wave or more.

5. A semiconductor laser device according to claim 1 wherein a protrusive region of said first semiconductor layer disposed on said protrusive portion of said second semiconductor layer is surrounded by a region of said first semiconductor layer having a thickness larger than that of said protrusive region.

6. In a semiconductor laser device comprising a semiconductor body of a first conductivity type having a major surface and a plurality of contiguous semiconductor layers disposed on said major surface of said body, said plurality of contiguous semiconductor layers being comprised of:
   (i) a first semiconductor layer having a laser active region, a pair of end surfaces parallel to each other so as to form a cavity resonator, and two opposite plane surfaces, a first surface of which faces towards said major surface of said body and second surface of which faces away from said major surface of said body;
   (ii) a second semiconductor layer disposed on said first surface, comprised of a material having a band gap broader than that of said first semiconductor layer,
   (iii) a third semiconductor layer disposed on said second surface comprised of a material having a band gap broader than that of said first semiconductor layer, wherein said second and third semiconductor layers have a thickness larger than a distance r in which an evanescent wave along said first surface decays by 1/e, and further wherein said second semiconductor layer is caved in toward said semiconductor body, said first semiconductor layer covering said second semiconductor layer is caved in along the caved portion of said second semiconductor layer, and said third semiconductor layer covering said first semiconductor layer is caved in along the caved portion of said first semiconductor layer.

7. A semiconductor laser device according to claim 6 wherein said semiconductor body has a groove on said major surface, and said second semiconductor layer is caved in along said groove of said body.

8. A semiconductor laser device according to claim 6 wherein said the caved depth D of said first semiconductor layer is larger than the distance r in which the evanescent wave decays by 1/e.

9. A semiconductor laser device according to claim 6 wherein a caved incline angle $\theta°$ is as large as a critical angle of the laser wave or more.

10. A semiconductor laser device according to claim 6 wherein a caved region of said first semiconductor layer disposed on said caved portion of said second semiconductor layer is surrounded by a region of said first semiconductor layer having a thickness larger than that of said caved region.

* * * * *